(12) United States Patent
Zhou et al.

(10) Patent No.: US 10,720,919 B2
(45) Date of Patent: Jul. 21, 2020

(54) APPARATUS AND METHODS FOR REDUCING CHARGE INJECTION MISMATCH IN ELECTRONIC CIRCUITS

(71) Applicant: Analog Devices, Inc., Norwood, MA (US)

(72) Inventors: Jie Zhou, Saratoga, CA (US); Arthur J. Kalb, Santa Clara, CA (US)

(73) Assignee: Analog Devices, Inc., Norwood, MA (US)

( * ) Notice: Subject to any disclaimer, the term of this patent is extended or adjusted under 35 U.S.C. 154(b) by 445 days.

(21) Appl. No.: 14/534,662

(22) Filed: Nov. 6, 2014

(65) Prior Publication Data
US 2016/0134278 A1    May 12, 2016

(51) Int. Cl.
*H03K 17/687*    (2006.01)
*H03K 19/0185*    (2006.01)

(52) U.S. Cl.
CPC ....... *H03K 17/687* (2013.01); *H03K 19/0185* (2013.01)

(58) Field of Classification Search
CPC .......... H03F 3/005; H03F 3/387; H03F 3/393; H03F 3/45475; H03F 3/45955; H03F 3/45977; H03K 17/56; H03K 17/687; H03K 5/249
See application file for complete search history.

(56) References Cited

U.S. PATENT DOCUMENTS

| 4,468,607 A | 8/1984 | Tanaka et al. |
| 4,800,303 A | 1/1989 | Graham et al. |
| 5,006,854 A | 4/1991 | White et al. |
| 5,305,004 A | 4/1994 | Fattaruso |

(Continued)

FOREIGN PATENT DOCUMENTS

| CN | 103066930 A | 4/2013 |
| JP | 2010141406 A | 6/2010 |
| WO | WO 2006/053098 | 5/2006 |

OTHER PUBLICATIONS

Conroy et al., Statistical Design Techniques for D/A Converters, IEEE Journal of Solid-State Circuits, vol. 24, No. 4, Aug. 1989, 11 pages.

(Continued)

*Primary Examiner* — Lincoln D Donovan
*Assistant Examiner* — Colleen J O Toole
(74) *Attorney, Agent, or Firm* — Knobbe, Martens, Olson & Bear, LLP

(57) ABSTRACT

Apparatus and methods for reducing charge injection mismatch are provided herein. In certain implementations, an electronic circuit includes one or more switch banks. Each switch bank can include a selection circuit and a plurality of switches that can be controlled using one or more clock signals. The selection circuit can select a first portion of the switches for operation in a first switch group and a second portion of the switches for operation in a second switch group. During a calibration, the electronic circuit's charge injection mismatch can be directly or indirectly observed for different switch configurations of the switch banks. The electronic circuit can be programmed to operate with the selected switch configurations of the switch banks to provide the electronic circuit with small charge injection mismatch.

29 Claims, 12 Drawing Sheets

(56) References Cited

U.S. PATENT DOCUMENTS

| | | | |
|---|---|---|---|
| 5,404,142 A | 4/1995 | Adams et al. | |
| 5,684,482 A | 11/1997 | Galton | |
| 6,194,962 B1 | 2/2001 | Chen | |
| 6,259,313 B1 * | 7/2001 | Lewicki | G06G 7/1865 327/554 |
| 6,424,211 B1 | 7/2002 | Nolan et al. | |
| 6,476,671 B1 | 11/2002 | Tang | |
| 6,518,899 B2 | 2/2003 | Yu | |
| 6,549,062 B1 | 4/2003 | Washburn et al. | |
| 6,639,532 B1 * | 10/2003 | Liu | H03M 3/34 341/118 |
| 6,696,894 B1 | 2/2004 | Huang | |
| 6,697,286 B2 | 2/2004 | Nakagawa | |
| 6,744,280 B2 | 6/2004 | Morgan et al. | |
| 6,756,817 B2 | 6/2004 | Tamura et al. | |
| 6,812,735 B1 | 11/2004 | Pham | |
| 6,960,931 B2 | 11/2005 | Turcotte | |
| 7,046,182 B1 | 5/2006 | Ja et al. | |
| 7,049,889 B2 | 5/2006 | Kalb | |
| 7,173,552 B1 | 2/2007 | Garcia | |
| 7,342,411 B2 | 3/2008 | Vergis et al. | |
| 7,358,809 B2 | 4/2008 | Elder | |
| 7,521,957 B2 | 4/2009 | Koo | |
| 7,573,323 B2 | 8/2009 | Moholt et al. | |
| 7,733,120 B2 | 6/2010 | Kato et al. | |
| 7,945,868 B2 | 5/2011 | Pileggi et al. | |
| 8,072,262 B1 * | 12/2011 | Burt | H03F 3/005 327/124 |
| 8,502,557 B2 | 8/2013 | Kalb et al. | |
| 8,598,904 B2 | 12/2013 | Kalb et al. | |
| 8,884,646 B2 | 11/2014 | Kalb et al. | |
| 2003/0080810 A1 | 5/2003 | Reber | |
| 2004/0008054 A1 | 1/2004 | Lesea et al. | |
| 2005/0052141 A1 | 3/2005 | Thielemans et al. | |
| 2005/0127978 A1 | 6/2005 | Cranford et al. | |
| 2005/0189961 A1 | 9/2005 | Frans et al. | |
| 2006/0125563 A1 | 6/2006 | Elder | |
| 2007/0170981 A1 | 7/2007 | Burt et al. | |
| 2007/0194844 A1 | 8/2007 | Signori et al. | |
| 2009/0160479 A1 | 6/2009 | Lange et al. | |
| 2010/0295529 A1 | 11/2010 | Consoer | |
| 2014/0312967 A1 | 10/2014 | Nagahisa | |
| 2014/0340145 A1 | 11/2014 | Funato et al. | |
| 2015/0054576 A1 | 2/2015 | Zhou et al. | |
| 2015/0357979 A1 | 12/2015 | Ouchi | |

OTHER PUBLICATIONS

Garcia, Santiago Iriarte, 16-Bit D/A Converter having Switchable Current Sources and a Current Divider, University of Limerick, Limerick, Ireland, Oct. 1, 2003, 179 pages.

Carley, L.R., A noise-shaping coder topology for 15+ bit converters, IEEE Journal of Solid-State Circuits, vol. 24, No. 2, Apr. 1989, 7 pages.

Leung, B.H., Architectures for Multi-bit Oversampled A/D Converter Employing Dynamic Element Matching Techniques, Circuits and Systems, 1991, IEEE International Symposium, pp. 1657-1660, vol. 3, Jun. 11-14, 1991, 13 pages.

Flynn et al., Digital calibration incorporating redundancy of flash ADCs, Circuits and Systems II: IEEE Transactions on Analog and Digital Signal Processing, vol. 50, No. 5, pp. 205-213, May 2003.

Enz et al, Circuit Techniques for Reducing the Effects of Op-amp Imperfections: Auto zeroing, Correlated Double Sampling, and Chopper Stabilization, Proc. of IEEE, V. 84, No. 11, 1996, 31 pages.

Akita et al., A 0.06mm$^2$ 14nV/$\sqrt{Hz}$ Chopper Instrumentation Amplifier with Automatic Differential-Pair Matching, ISSCC 2013, Feb. 2013, 3 pages.

Witte et al, A CMOS Chopper Offset-Stabilized Opamp, IEEE JSSC, v.42, No. 7, 2007, 7 pages.

Wu, R., J.H. Huijsing, and K.A.A. Makinwa, A Current-Feedback Instrumentation Amplifier With a Gain Error Reduction Loop and 0.06% Untrimmed Gain Error, IEEE J. Solid-State Circuits, vol. 46, No. 12, pp. 2794-2806, Dec. 2011.

Kusuda, Y., Auto Correction Feedback for Ripple Suppression in a Chopper Amplifier, IEEE J. Solid-State Circuits, vol. 45, No. 8, pp. 1436-1445, Aug. 2010.

State Intellectual Property Office of the People's Republic of China; Office Action dated Dec. 20, 2016, from related application Chinese Patent Application No. 201410418603.3 (filed Aug. 22, 2014).

Office Action Issued in Chinese Application No. 201510744555.1 dated Dec. 25, 2017, 10 pages.

Notice of Allowance Issued in Chinese Application No. 201510744555.1 dated May 21, 2019 in 10 pages.

Office Action Issued in Chinese Application No. 201510744555.1 dated Dec. 27, 2018 in 9 pages.

Yen, R. C.; Gray, P. R.: A MOS switched-capacitor instrumentation amplifier; IEEE Journal of Solid-State Circuits; Band 17; 1982; Heft 6; Seiten 1008-1013.

Office Action Issued for German Patent Application No. 102015118534.2 dated Nov. 26, 2019 in 4 pages.

* cited by examiner

APPARATUS AND METHODS FOR REDUCING CHARGE INJECTION MISMATCH IN ELECTRONIC CIRCUITS

CROSS-REFERENCE TO RELATED APPLICATIONS

This application is related to U.S. application Ser. No. 13/298,210, filed on Nov. 16, 2011, entitled "ELECTRICAL NETWORKS AND METHODS OF FORMING THE SAME", now U.S. Pat. No. 8,598,904, issued Dec. 3, 2013, the disclosure of which is hereby incorporated by reference in its entirety herein.

BACKGROUND

Field

Embodiments of the invention relate to electronic devices, and more particularly, to electronic circuitry having low charge injection mismatch.

Description of the Related Technology

An electronic circuit can receive an input signal through switches that are controlled using a clock signal. For example, a pair of field effect transistors (FETs) can be provided at an electronic circuit's differential input, and the gate voltages of the FETs can be controlled using a clock signal to turn on or turn off the FETs to pass or block a differential signal.

Including switches at an input of an electronic circuit can be useful for a variety of purposes. For example, an amplifier can use switches for chopping or auto-zeroing operations of the amplifier. In another example, a switched capacitor circuit can include switches that are used in part for controlling a phase that the switched capacitor circuit operates in.

SUMMARY

In one embodiment, an apparatus includes a programmable memory, a switch bank, and an electronic circuit. The programmable memory is configured to generate a first control signal. Additionally, the switch bank is configured to receive a first input signal at a first input terminal and a second input signal at a second input terminal, and to generate a first output signal at a first output terminal and a second output signal at a second output terminal. The switch bank includes a selection circuit and a plurality of switches. The electronic circuit includes a first input configured to receive the first output signal from the switch bank and a second input configured to receive the second output signal from the switch bank. The selection circuit is configured to select a first portion of the plurality of switches for operation in a first switch group based on the first control signal, and to select a second portion of the plurality of switches for operation in a second switch group based on the first control signal. The first switch group is configured to operate in a first signal path between the first input terminal and the first output terminal of the switch bank, and the second switch group is configured to operate in a second signal path between the second input terminal and the second output terminal of the switch bank. The first switch group and the second switch group are controllable by a first clock signal.

In another embodiment, a method of reducing charge injection mismatch in an integrated circuit (IC) is provided. The method includes controlling a switch bank using a first clock signal, the switch bank electrically coupled to a first input and a second input of an electronic circuit. The method further includes observing a charge injection mismatch of the electronic circuit for each of a plurality of selected switch configurations of the switch bank. The switch bank includes a plurality of switches, and the selected switch configurations include different combinations of the plurality of switches in a first switch group and in a second switch group. The method further includes choosing a switch configuration based on the observations of the charge injection mismatch, and in a programmable memory, storing data corresponding to the chosen switch configuration such that the electronic circuit operates using the selected switch configuration.

DETAILED DESCRIPTION OF EMBODIMENTS

Figure 1A:
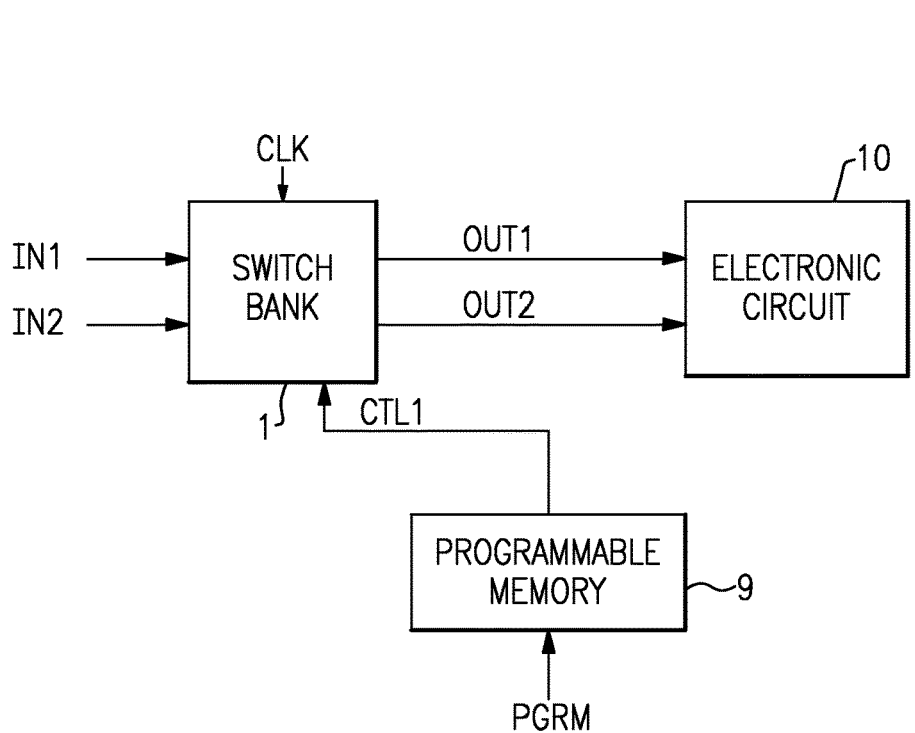
FIG. 1A is a schematic block diagram illustrating one embodiment of an integrated circuit (IC).

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Certain electronic circuits can use switches controlled by a clock signal. For instance, in one example, a chopper amplifier can include input chopping switches that can be used to modulate a differential input signal using a chopping clock signal before it is provided to amplification circuitry. In another example, an auto-zero amplifier can include auto-zero switches that can be used to control operation of an amplifier between an auto-zero phase and an amplification phase, and the differential input signal can pass through the auto-zero switches during the amplification phase. Other examples of electronic circuits using switches controlled by a clock signal include analog-to-digital converters (ADCs) and switched capacitor circuits.

Although using clock-controlled switches in an electronic circuit can be useful in a variety of applications, such switches can also generate charge injection. For instance, when the switches are implemented using field-effect transistors (FETs) having gates controlled by a clock signal, displacement currents can flow through parasitic gate-to-source and/or gate-to-drain capacitors in response to rising or falling edges of the clock signal. The injected charge can accumulate over time, and can undesirably lead to a flow of current and/or an offset error.

Apparatus and methods for reducing charge injection mismatch are provided herein. In certain implementations, an electronic circuit includes one or more switch banks. Each switch bank can include a selection circuit and a plurality of switches that can be controlled using one or more clock signals. The selection circuit can select a first portion of the switches for operation in a first switch group and a second portion of the switches for operation in a second switch group. During a calibration, the electronic circuit's charge injection mismatch can be directly or indirectly observed for different switch configurations of the switch banks. Although the switches of a particular bank can be designed to have about the same drive strength and/or geometry, the electronic circuit can have a different charge injection mismatch in different switch configurations due to manufacturing mismatch between switches, such as process variation. The electronic circuit can be programmed to operate with the selected switch configurations of the switch banks to provide the electronic circuit with small charge injection mismatch.

The charge injection mismatch reduction schemes described herein can be used in a wide variety of electronic systems and applications.

In certain configurations, one or more switch banks can be included in a chopper and/or auto-zero amplifier to provide the amplifier with small charge injection mismatch, which in turn can decrease the amplifier's residual differential input current which often shows up as an input offset voltage. More generally, charge injection errors can manifest in several ways which will be termed charge-injection-related errors.

For example, an amplifier can include chopping and/or auto-zeroing circuitry to reduce the amplifier's input offset voltage. Ideally, chopper and/or auto-zero amplifiers should not have any residual input offset voltage, or input offset voltage remaining after chopping and/or auto-zeroing operations. However, non-idealities in switches used to provide chopping and/or auto-zeroing can lead to a residual differential input current and a corresponding residual input offset voltage of, for instance, about 1 µV to 100 µV.

The residual differential input current can arise from a variety of sources, including, charge injection mismatch between pairs of switches. For instance, the amplifier can include switches implemented using FETs having gates controlled using one or more clock signals, and displacement currents can flow through parasitic gate-to-source and/or gate-to-drain capacitors of the FETs in response to clock signal transitions. Although ideally charge injection should not be present in differential configurations, transistor mismatch can lead to a charge injection imbalance and a resulting differential input current.

In certain configurations, an amplifier includes one or more switch banks that each include a selection circuit and a plurality of switches. During a calibration, the amplifier's residual charge-injection-related errors can be observed for different switch configurations of the banks. Although the switches of a particular bank can be designed to be substantially identical, the amplifier can nevertheless have different residual charge-injection-related errors in different switch configurations due to manufacturing mismatch between switches. To reduce the amplifier's residual charge-injection-related errors, the amplifier can be programmed to operate with switch configurations associated with reduced or minimal residual charge-injection-related errors.

The amplifiers herein can achieve low residual charge-injection-related errors with a relatively small impact on the amplifier's size, power consumption, and/or amplification characteristics relative to certain other residual charge-injection-related error reduction schemes. Furthermore, certain amplifiers herein can have small output voltage ripple, small input offset voltage, low input offset voltage drift, and/or low flicker noise. The teachings herein are applicable to a wide variety of types of amplifiers, including, for example, operational amplifiers and instrumentation amplifiers.

FIG. 1A is a schematic block diagram illustrating one embodiment of an integrated circuit (IC) 18. The IC 18 includes a switch bank 1, a programmable memory 9, and an electronic circuit 10.

The illustrated switch bank 1 includes a first input terminal that receives a first input signal IN1, a second input terminal that receives a second input signal IN2, a clock input terminal that receives a clock signal CLK, a control input terminal that receives a first control signal CTL1, a first output terminal that generates a first output signal OUT1, and a second output terminal that generates a second output signal OUT2.

The programmable memory 9 receives a programming signal PGRM, which can be used to program a state of the programmable memory 9. The programmable memory 9 generates the first control signal CTL1 based on the programmable memory's state. Although FIG. 1A illustrates the programmable memory 9 as generating one control signal, the programmable memory 9 can generate one or more additional control signals. Furthermore, although FIG. 1A illustrates the programmable memory 9 as receiving one programming signal, the programmable memory 9 can receive one or more additional programming signals. For example, the programmable memory 9 can be programmed over a signaling interface or bus.

As shown in FIG. 1A, the electronic circuit 10 includes a first input that receives the first output signal OUT1 from the switch bank 1 and a second input that receives the second output signal OUT2 from the switch bank 1. The electronic circuit 10 can include circuitry implemented in a wide variety of configurations. For instance, in one example, the electronic circuit 10 comprises an amplification circuit that amplifies a differential signal outputted by the switch bank 1. In another example, the electronic circuit 10 comprises two or more capacitors used to sample the first output signal OUT1 and the second output signal OUT2 in response to a rising or falling edge of the clock signal CLK. In another example, the electronic circuit 10 comprises an analog-to-digital converter that generates a digital representation of an analog voltage difference between the first output signal OUT1 and the second output signal OUT2. Although various example implementations of the electronic circuit 10 have been described, other configurations of the electronic circuit 10 are possible.

The switch bank 1 can include a selection circuit and a plurality of switches. Additionally, the switches can be individually selected for operation in a first switch group or subcircuit that operates in a first signal path between the switch bank's first input terminal and first output terminal or for operation in a second switch group or subcircuit that operates in a second signal path between the switch bank's second input terminal and second output terminal. In certain implementations, the switches have about the same geometry on lithographical masks used to fabricate the IC 18.

As shown in FIG. 1A, the switch bank 1 receives the first control signal CTL1 from the programmable memory 9. The first control signal CTL1 can configure the switch bank 1 with particular configuration of switches coupled to the bank's terminals. For example, the bank's selection circuit can use the first control signal CTL1 to select a first portion of the switches for operation in the first switch group and a second portion of the switches for operation in the second switch group.

During device fabrication, each switch from the switch bank 1 can incur mismatch, which can lead to the switches generating different amounts of charge injection during rising and/or falling edges of the clock signal CLK. For instance, when the switches are implemented using field-effect transistors (FETs) having gates controlled using the clock signal CLK, displacement currents can flow through parasitic gate-to-source and/or gate-to-drain capacitors in response to transitions of the clock signal CLK. For a given switch configuration, the electronic circuit 10 can have a charge injection mismatch, which may vary with operating point, such as temperature, supply voltage, bias current, and/or common-mode input voltage.

In certain configurations, the charge injection mismatch can be determined during a calibration for a variety of switch configurations of the switch bank 1. Additionally, the data can be used to determine a particular switch configuration of the switch bank 1 having small charge injection mismatch. Additionally, the programmable memory 9 can be programmed with data corresponding to the selected switch configuration, such that the integrated circuit 18 operates with the selected switch configuration of the switch bank 1 during operation.

Thus, the switch bank 1 can be programmed to operate with a switch configuration having reduced or minimum charge injection mismatch relative to other possible switch configurations of the switch bank 1.

In certain configurations, the programmable memory 9 can be a non-volatile memory, including, for example, a flash memory, a read-only memory (ROM), EEPROM, a memory implemented using fuses and/or anti-fuses, and/or a magnetic storage device. However, other configurations are possible, such as implementations in which the programmable memory 9 is a volatile memory that is programmed to include data corresponding to the selected switch configuration during power-up or turn-on and/or programmed with the data during a calibration sequence.

Although the integrated circuit 18 is illustrated as including one switch bank, the teachings herein are applicable to configurations in which an integrated circuit includes one or more additional switch banks. In such configurations, the programmable memory 9 can be configured to provide additional control signals for the additional switch banks.

Figure 1B:
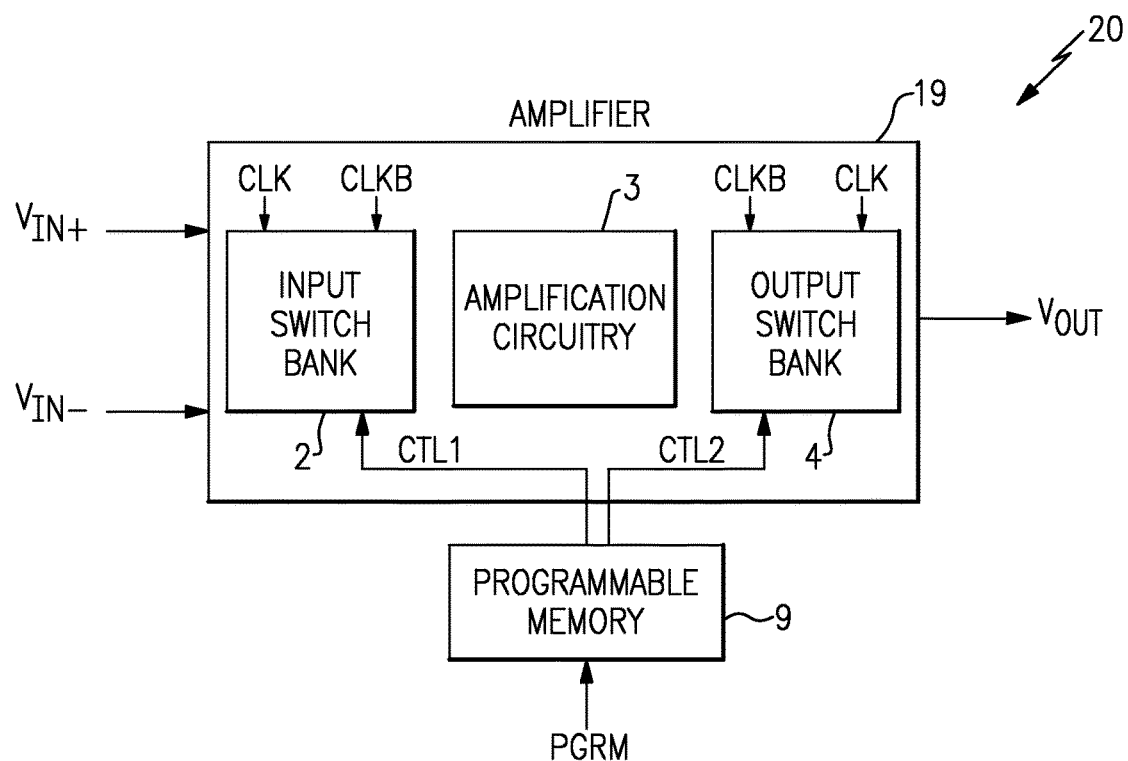
FIG. 1B is a schematic block diagram illustrating another embodiment of an IC.

FIG. 1B is a schematic block diagram illustrating another embodiment of an IC 20. The IC 20 includes a programmable memory 9 and an amplifier 19.

The illustrated amplifier 19 includes an input switch bank 2, amplification circuitry 3, and an output switch bank 4. The amplifier 19 can receive the first control signal CTL1 and a differential input signal corresponding to a difference between a voltage of a positive or non-inverting input voltage terminal $V_{IN+}$ and a voltage of a negative or inverting input voltage terminal $V_{IN-}$. Additionally, the amplifier 19 can amplify the differential input signal using the amplification circuitry 3 to generate an output voltage on the output voltage terminal $V_{OUT}$.

Although FIG. 1B illustrates a configuration in which the amplifier 19 generates a single-ended output voltage signal, the amplifier 19 can be adapted to generate other output signals, including, for example, a differential output voltage signal, a single-ended output current signal, a differential output current signal, or a combination thereof. Additionally, although FIG. 1B illustrates the amplifier 19 in an open-loop configuration, some embodiments may use the amplifier 19 in a closed-loop configuration.

The input switch bank 2 receives a non-inverted clock signal CLK and an inverted clock signal CLKB, which can be used to control chopping and/or auto-zeroing operations to reduce the amplifier's input offset voltage. Additionally, the output switch bank 4 receives the inverted clock signal CLKB and the non-inverted clock signal CLKB, which can be used to control chopping and/or auto-zeroing operations.

In one embodiment, the non-inverted and inverted clock signals CLK, CLKB can control the input switch bank 2 to chop or modulate the input signal before it is amplified by the amplification circuitry 3 of the amplifier 19. Additionally, the non-inverted and inverted clock signals CLK, CLKB can control the output switch bank 4 to chop or demodulate the amplified differential input signal, which can be further amplified and/or otherwise processed to generate the amplifier's output voltage. In another embodiment, the non-inverted and inverted clock signals CLK, CLKB can control the input switch bank 2 and the output switch bank 4 to aid in providing auto-zeroing, such as by disconnecting the amplification circuitry 3 from the amplifier's amplification path when the amplification circuitry 3 is being auto-zeroed.

Although FIG. 1B illustrates one specific implementation of clock signals, the input switch bank 2 and/or the output switch bank 4 can receive more or fewer clock signals and/or a different combination of clock signals, including, for example, clock signals with overlap or non-overlap.

The input switch bank 2 can include a selection circuit and a plurality of input switches. Additionally, the input switches can be individually selected for operation in either a first switch group or subcircuit associated with the non-inverting input voltage terminal $V_{IN+}$ or a second switch group or subcircuit associated with the inverting input voltage terminal $V_{IN-}$. As shown in FIG. 1B, the input switch bank 2 can receive the first control signal CTL1 from the programmable memory 9. The first control signal CTL1 can be used to configure the input switch bank 2 with particular configuration of switches coupled to the bank's terminals. Similarly, the output switch bank 4 can include a selection circuit and a plurality of output switches, and can operate differentially. Additionally, the output switch bank 4 receives a second control signal CTL2 which can be used to configure the output switch bank 4 with particular configuration of switches.

During device fabrication, each switch from the input switch bank 2 and each switch from the output switch bank 4 can incur mismatch. For given switch configurations of the input switch bank 2 and the output switch bank 4, the amplifier 19 can have a residual input offset voltage resulting at least in part from charge injection mismatch. The residual input offset voltage may vary with operating point, such as temperature, supply voltage, bias current, and/or common-mode input voltage.

In certain configurations, the residual charge-injection-related errors of the amplifier 19 can be determined during a calibration for a variety of switch configurations of the input switch bank 2 and for the output switch bank 4. Additionally, the data can be used to determine a particular switch configuration of the input switch bank 2 and a particular switch configuration of the output switch bank 4 having low residual charge-injection-related errors. Additionally, the programmable memory 9 can be programmed with data corresponding to the selected switch configurations, such that the amplifier 19 operates with the selected switch configurations during operation.

In the illustrated configuration, the amplifier 19 includes both an input switch bank and an output switch bank. However, the teachings herein are applicable to other configurations, such as implementations in which the input switch bank or the output switch bank are omitted and/or implementations included additional input and/or output switch banks.

Figure 2A:
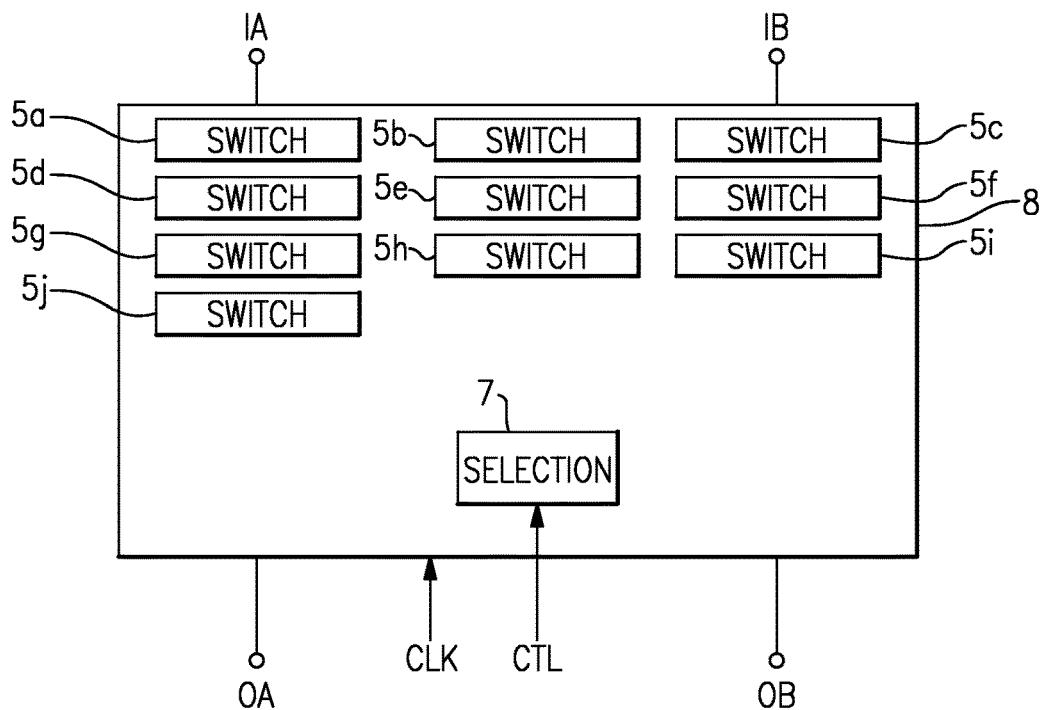
FIGS. 2A and 2B are schematic block diagrams of a switch bank according to one embodiment.
Figure 2B:
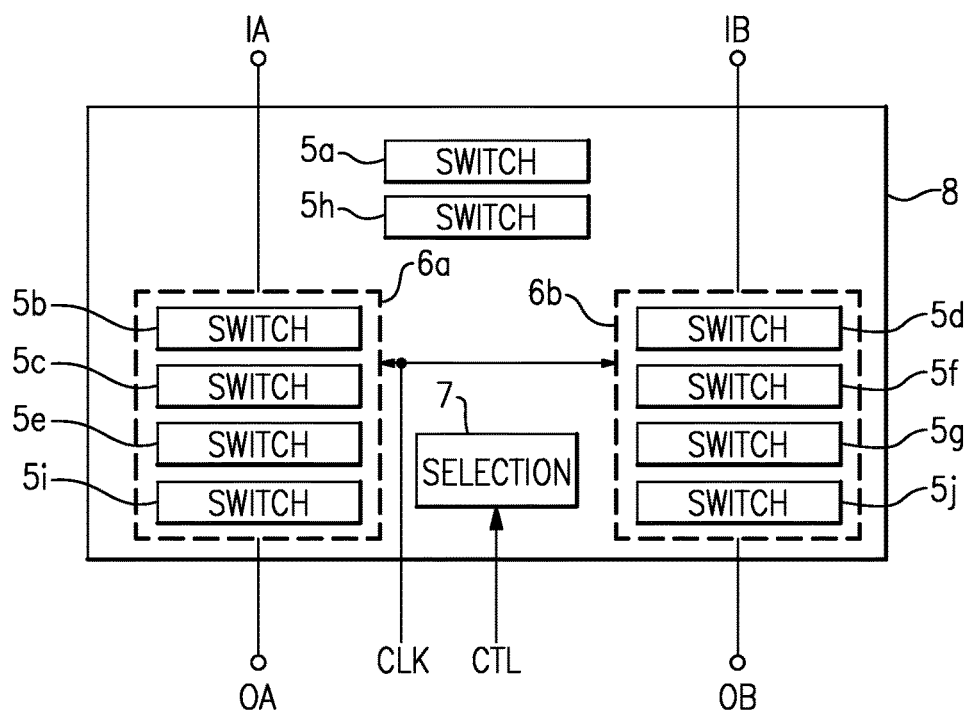

FIGS. 2A and 2B are schematic block diagrams of a switch bank 8 according to one embodiment. FIG. 2A illustrates the switch bank 8 prior to configuration by a control signal CTL, and FIG. 2B illustrates one example of the switch bank 8 after configuration by the control signal CTL.

The switch bank 8 illustrates one implementation of a switch bank. The switch bank 8 can be used to implement, for example, the switch bank 1 of FIG. 1A. However, the switch bank 1 can be implemented in other ways, including, for example, configurations using more or fewer switches and/or using additional switch groups. Additionally, a switch bank can include additional components, terminals, and/or circuitry which are not illustrated in FIGS. 2A and 2B for clarity.

The switch bank 8 includes a first input terminal IA, a second input terminal IB, a first output terminal OA, a second output terminal OB, first to tenth switches 5a-5j, and a selection circuit 7. Additionally, the selection circuit 7 receives the control signal CTL, which can be used to select a first portion of the switches 5a-5j for operation in a first switch group 6a and to select a second portion of the switches 5a-5j for operation in a second switch group 6b. The switches in the first switch group 6a can have switch inputs electrically connected to the first input terminal IA, switch outputs electrically connected to the first output terminal OA, and clock inputs that receive a clock signal CLK. Additionally, the switches in the second switch group 6b can have switch inputs electrically connected to the second input terminal IB, switch outputs electrically connected to the second output terminal OB, and clock inputs that receive the clock signal CLK.

In certain implementations, the switches 5a-5j are designed to have substantially the same drive-strength and/or geometry absent manufacturing variation, and the selection circuit 7 is configured to include an equal number of switches in the first and second switch groups 6a, 6b.

During fabrication of an integrated circuit that includes the switch bank 8, each of the switches 5a-5j can incur random mismatch, which can lead to a charge injection mismatch. For a given configuration of the switches in the first and second switch groups 6a, 6b, the total contribution of the switch bank 8 to the charge injection mismatch can be based on the mismatch of the switches in the first switch group 6a relative to the mismatch of the switches in the second switch group 6b.

During a calibration of an integrated circuit that includes the switch bank 8, different selected combinations of switches can be included in the first and second switch groups 6a, 6b, and a charge injection mismatch can be observed for each selected switch configuration. Additionally, based on the data, a particular switch configuration can be selected, such as a combination of switches associated with the smallest charge injection mismatch. Additionally, a programmable memory, such as the programmable memory 9 of FIG. 1A, can be programmed with data corresponding to the selected switch configuration. The programmable memory can generate the control signal CTL, which the selection circuit 7 can use to select the switches that operate in the first and second switch groups 6a, 6b.

In the example shown in FIG. 2B, the selection circuit 7 has used the control signal CTL to select the second, third, fifth, and ninth switches 5b, 5c, 5e, 5i for operation in the first switch group 6a. Additionally, the selection circuit 7 has used the control signal CTL to select the fourth, sixth, seventh, and tenth switches 5d, 5f, 5g, 5j for operation in the second switch group 6b. Furthermore, in the illustrated example, the first and eighth switches 5a, 5h have not been selected for operation in either the first or second switch groups 6a, 6b. Although FIG. 2B shows one example of a possible distribution of the switches 5a-5j between the first and second switch groups 6a, 6b, the distribution shown in FIG. 2B is merely illustrative, and the switch bank 8 can be configured in other ways.

Although the illustrated switch bank 8 includes ten switches, a switch bank can be adapted to include more or fewer switches. In one embodiment, a switch bank includes between about 4 and about 24 switches. However, other configurations are possible.

The switches 5a-5j can correspond to switches of a wide variety of types. In one embodiment, the switches 5a-5j include field-effect transistors (FETs), such as metal oxide semiconductor (MOS) transistors. As used herein and as persons having ordinary skill in the art will appreciate, MOS transistors can also have gates made out of materials that are not metals, such as poly silicon, and can have dielectric regions implemented not just with silicon oxide, but with other dielectrics, such as high-k dielectrics.

As described above, the selection circuit 7 can use the control signal CTL to select a first portion of the switches 5a-5j to include in the first switch group 6a and to select a second portion of the switches 5a-5j to include in the second switch group 6b. In the illustrated configuration, less than all of the switches 5a-5j are selected for operation in the first and second switch groups 6a, 6b. However, other configurations are possible, such as implementations in which all of the switches 5a-5j are included in either the first switch group 6a or in the second switch group 6b.

In certain implementations, the selection circuit 7 can include circuitry for selectively including any particular switches in either the first switch group 6a or in the second switch group 6b. However, in other configurations, certain switches can be selectively included in only one particular switch group. For example, in one embodiment, the selection circuit 7 selects the first switch group 6a from a first set or pool of switches and selects the second switch group 6b from a second set of switches, where at least a portion of the switches in the first and second sets of switches are different.

Figure 3A:
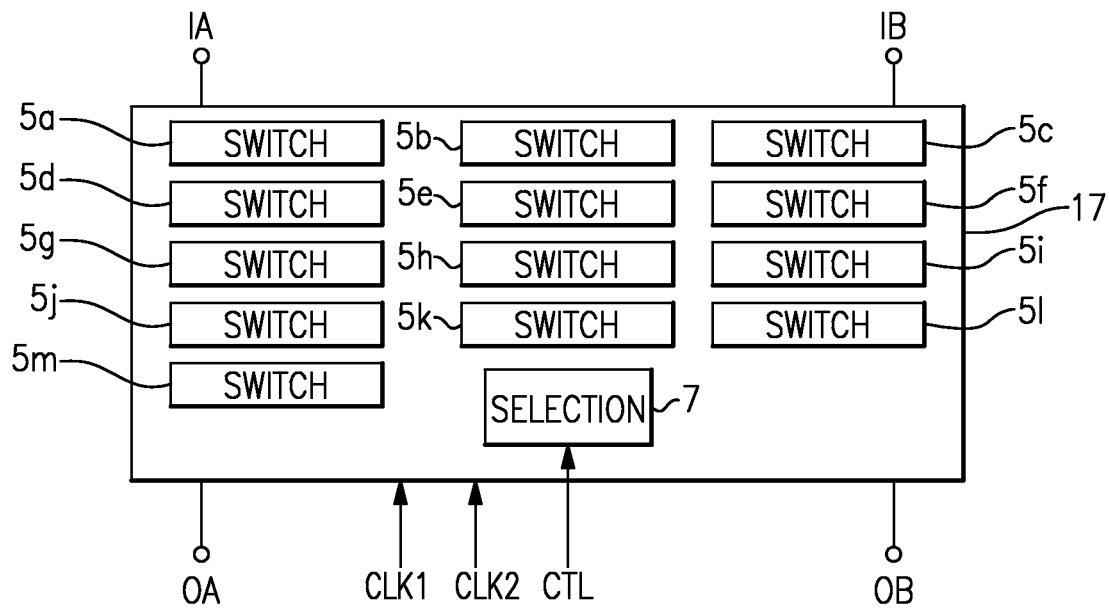
FIGS. 3A and 3B are schematic block diagrams of a switch bank according to another embodiment.
Figure 3B:
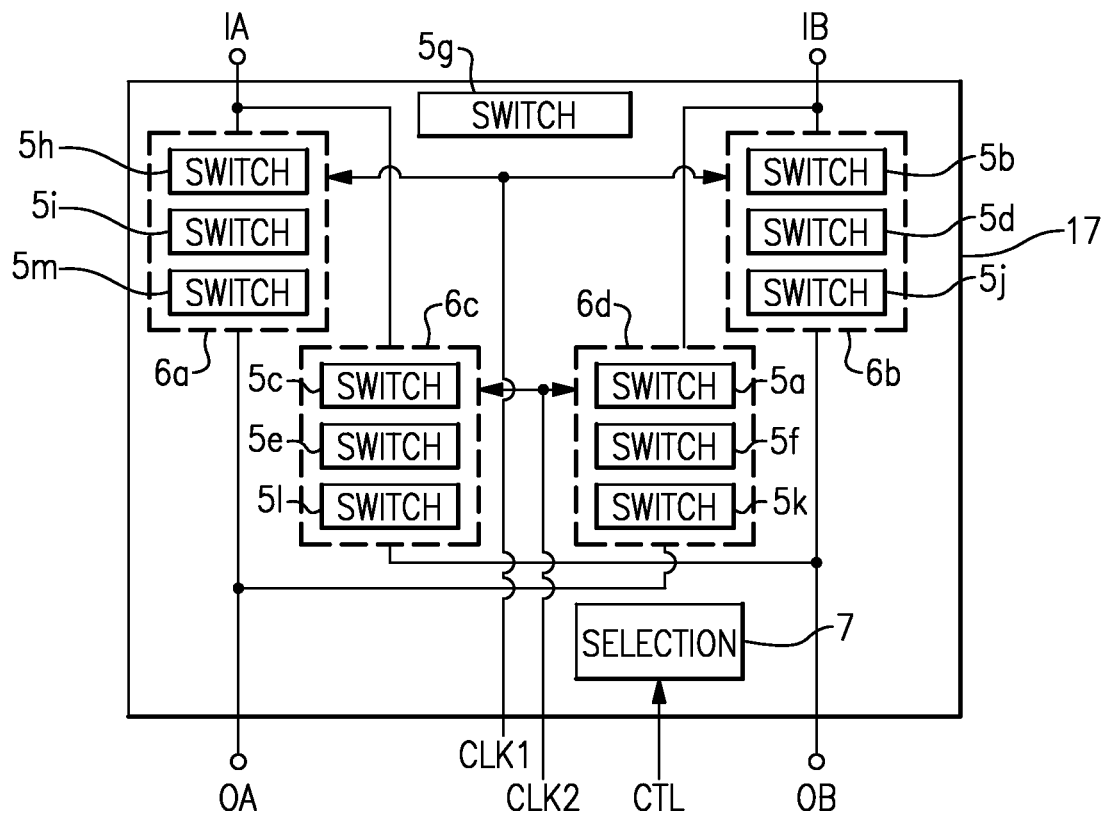

FIGS. 3A and 3B are schematic block diagrams of a switch bank 17 according to one embodiment. FIG. 3A illustrates the switch bank 17 prior to configuration by a control signal CTL, and FIG. 3B illustrates one example of the switch bank 17 after configuration by the control signal CTL.

The switch bank 17 illustrates one implementation of a switch bank. The switch bank 17 can be used to implement, for example, the input switch bank 2 of FIG. 1B and/or the output switch bank 4 of FIG. 1B. However, the input switch bank 2 and/or the output switch bank 4 of FIG. 1B can be implemented in other ways.

The switch bank 17 includes a first input terminal IA, a second input terminal IB, a first output terminal OA, a second output terminal OB, first to thirteenth switches 5a-5m, and a selection circuit 7. Additionally, the selection circuit 7 receives the control signal CTL, which can be used to select a first portion of the switches 5a-5m for operation in a first switch group 6a, to select a second portion of the switches 5a-5m for operation in a second switch group 6b, to select a third portion of the switches 5a-5m for operation in a third switch group 6c, and to select a fourth portion of the switches 5a-5m for operation in a fourth switch group 6d.

In the illustrated configuration, the switches in the first switch group 6a can have switch inputs electrically connected to the first input terminal IA, switch outputs electrically connected to the first output terminal OA, and clock inputs that receive the first clock signal CLK1. Additionally, the switches in the second switch group 6b can have switch inputs electrically connected to the second input terminal IB, switch outputs electrically connected to the second output terminal OB, and clock inputs that receive the first clock signal CLK1. Furthermore, the switches in the third switch group 6c can have switch inputs electrically connected to the first input terminal IA, switch outputs electrically connected to the second output terminal OB, and clock inputs that receive the second clock signal CLK2. Additionally, the switches in the fourth switch group 6d can have switch inputs electrically connected to the second input terminal IB, switch outputs electrically connected to the first output terminal OA, and clock inputs that receive the second clock signal CLK2.

The illustrated switch bank 17 can be used to provide a chopping operation to a differential input signal received between the first and second input terminals IA, IB. For example, when the first clock signal CLK1 is logically high and the second clock signal CLK2 is logically low, the first and second switch groups 6a, 6b can be used to electrically connect the first input terminal IA to the first output terminal OA and to electrically connect the second input terminal IB to the second output terminal OB. Additionally, when the first clock signal CLK1 is logically low and the second clock signal CLK2 is logically high, the third and fourth switch groups 6c, 6d can be used to electrically connect the first input terminal IA to the second output terminal OB and to electrically connect the second input terminal IB to the first output terminal OA.

In certain implementations, the switches 5a-5m are designed to have substantially the same drive-strength and/or geometry absent manufacturing variation. However, during fabrication of an amplifier that includes the switch bank 17, each of the switches 5a-5m can incur random mismatch, which can lead to residual charge-injection-related errors of the amplifier. For a given configuration of the switches in the first to fourth switch groups 6a-6d, the total contribution of the switch bank 17 to the amplifier's residual charge-injection-related errors can be based on the mismatch of the switches in the first switch group 6a relative to the mismatch of the switches in the second switch group 6b and on the mismatch of the switches in the third switch group 6c relative to the mismatch of the switches in the fourth switch group 6d.

During a calibration of an amplifier that includes the switch bank 17, different selected combinations of switches can be included in the first to fourth switch groups 6a-6d, and residual charge-injection-related errors of the amplifier can be observed for each selected switch configuration. Additionally, based on the data, a particular switch configuration can be selected, such as a combination of switches associated with the smallest residual charge-injection-related errors. Additionally, a programmable memory, such as the programmable memory 9 of FIG. 1B, can be programmed with data corresponding to the selected switch configuration. The programmable memory can generate the control signal CTL, which the selection circuit 7 can use to select the switches that operate in the switch groups 6a-6d.

In the example shown in FIG. 3B, the selection circuit 7 has used the control signal CTL to select the eighth, ninth, and thirteenth switches 5h, 5i, 5m for operation in the first switch group 6a. Additionally, the selection circuit 7 has used the control signal CTL to select the second, fourth, and tenth switches 5b, 5d, 5j for operation in the second switch group 6b. Furthermore, the selection circuit 7 has used the control signal CTL to select the third, fifth, and twelfth switches 5c, 5e, 5l for operation in the third switch group 6c. Additionally, the selection circuit 7 has used the control signal CTL to select the first, sixth, and eleventh switches 5a, 5f, 5k for operation in the fourth switch group 6d. Furthermore, in the illustrated example, the seventh switch 5g has not been selected for operation in any of the switch groups 6a-6d. Although FIG. 3B shows one example of a possible distribution of the switches 5a-5m between the switch groups 6a-6d, the distribution shown in FIG. 3B is merely illustrative, and the switch bank 17 can be configured in other ways.

Although the illustrated switch bank 17 includes thirteen switches, a switch bank can be adapted to include more or fewer switches. The switches 5a-5m can correspond to switches of a wide variety of types, including, for example FETs.

In the illustrated configuration, less than all of the switches 5a-5m are selected for operation in the switch groups 6a-6d. However, other configurations are possible, such as implementations in which all of the switches 5a-5m are included in a switch group. In certain implementations, the selection circuit 7 can include circuitry for selectively including any particular switches in the first switch group 6a, the second switch group 6b, the third switch group 6c, or the fourth switch group 6d. However, in other configurations, certain switches can be selectively included in only one particular switch group. For example, the selection circuit 7 can select switches used in the switch groups 6a-6d from two or more pools of switches, where at least a portion of the switches in the pools of switches are different.

Figure 4A:
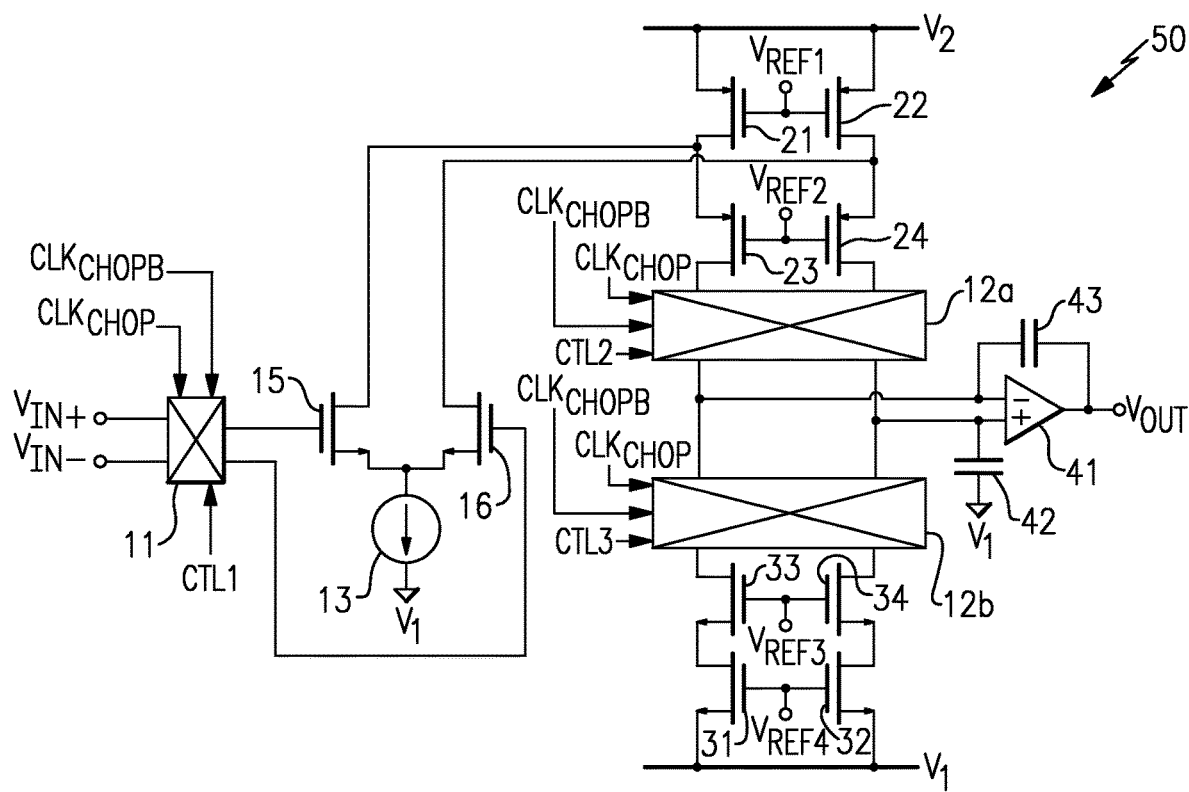
FIG. 4A is a circuit diagram of a chopper amplifier according to one embodiment.

FIG. 4A is a circuit diagram of a chopper amplifier 50 according to one embodiment. The chopper amplifier 50 includes a first or non-inverting input voltage terminal $V_{IN+}$, a second or inverting input voltage terminal $V_{IN-}$, an output voltage terminal $V_{OUT}$, an input chopping switch bank 11, a first output chopping switch bank 12a, a second output chopping switch bank 12b, a current source 13, first and second n-type metal oxide semiconductor (NMOS) input transistors 15, 16, first and second p-type metal oxide semiconductor (PMOS) load transistors 21, 22, first and second PMOS cascode transistors 23, 24, first and second NMOS load transistors 31, 32, first and second NMOS cascode transistors 33, 34, an output amplification circuit 41, an integration capacitor 42, and a feedback capacitor 43.

Although the chopper amplifier 50 of FIG. 4A illustrates one example of a chopper amplifier that can include one or more switch banks, the teachings herein are applicable a wide variety of electronic circuits, including, for example, amplifiers implemented using other circuit topologies.

The input chopping switch bank 11 includes a first input terminal electrically connected to the non-inverting input voltage terminal $V_{IN+}$, a second input terminal electrically connected to the inverting input terminal $V_{IN-}$, a first output terminal electrically connected to a gate of the first NMOS input transistor 15, and a second output terminal electrically connected to a gate of the second NMOS input transistor 16. The input chopping switch bank 11 further includes a first clock terminal that receives a non-inverted chopping clock signal $CLK_{CHOP}$, a second clock terminal that receives an inverted chopping clock signal $CLK_{CHOPB}$, and a control terminal that receives a first control signal CTL1. The current source 13 includes a first end electrically connected to the sources of the first and second NMOS input transistors 15, 16 and a second end electrically connected to a first supply voltage $V_1$, which can be, for example, a power low or ground supply. The current source 13 can be used to provide a bias or tail current to the first and second NMOS input transistors 15, 16, which operate as a differential transistor pair. The first NMOS input transistor 15 further includes a drain electrically connected to a drain of the first PMOS load transistor 21 and to a source of the first PMOS cascode transistor 23. The second NMOS input transistor 16 further includes a drain electrically connected to a drain of the second PMOS load transistor 22 and to a source of the second PMOS cascode transistor 24. The first PMOS load transistor 21 further includes a gate electrically connected to a first reference voltage $V_{REF1}$ and to a gate of the second PMOS load transistor 22. The first PMOS load transistor 21 further includes a source electrically connected to a second supply voltage $V_2$, which can be, for example, a power high supply. The second PMOS load transistor 22 further includes a source electrically connected to the second supply voltage $V_2$. The first PMOS cascode transistor 23 further includes a gate electrically connected to a second reference voltage $V_{REF2}$ and to a gate of the second PMOS cascode transistor 24.

The first output chopping switch bank 12a includes a first input terminal electrically connected to a drain of the first PMOS cascode transistor 23, a second input terminal electrically connected to a drain of the second PMOS cascode transistor 24, a first output terminal electrically connected to an inverting input of the output amplification circuit 41, and a second output terminal electrically connected to a non-inverting input of the output amplification circuit 41. The first output chopping switch bank 12a further includes a first clock terminal that receives the inverted chopping clock signal $CLK_{CHOPB}$, a second clock terminal that receives the non-inverted chopping clock signal $CLK_{CHOP}$, and a control terminal that receives a second control signal CTL2. The feedback capacitor 43 includes a first end electrically connected to the inverting input of the output amplification circuit 41 and a second end electrically connected to an output of the output amplification circuit 41 and to the output voltage terminal $V_{OUT}$. The integration capacitor 42 includes a first end electrically connected to the non-inverting input of the output amplification circuit 41 and a second end electrically connected to the first supply voltage $V_1$.

The second output chopping switch bank 12b includes a first output terminal electrically connected to the inverting input of the output amplification circuit 41, a second output terminal electrically connected to the non-inverting input of the output amplification circuit 41, a first input terminal electrically connected to a drain of the first NMOS cascode transistor 33, and a second input terminal electrically connected to a drain of the second NMOS cascode transistor 34. The second output chopping switch bank 12b further includes a first clock terminal that receives the inverted chopping clock signal $CLK_{CHOPB}$, a second clock terminal that receives the non-inverted chopping clock signal $CLK_{CHOP}$, and a control terminal that receives a third control signal CTL3. The first NMOS cascode transistor 33 further includes a gate electrically connected to a third reference voltage $V_{REF3}$ and to a gate of the second NMOS cascode transistor 34. The first NMOS cascode transistor 33 further includes a source electrically connected to a drain of the first NMOS load transistor 31. The second NMOS cascode transistor 34 further includes a source electrically connected to a drain of the second NMOS load transistor 32. The first NMOS load transistor 31 further includes a source electrically connected to the first supply voltage $V_1$ and a gate electrically connected to a fourth reference voltage $V_{REF4}$ and to a gate of the second NMOS load transistor 32. The second NMOS load transistor 32 further includes a source electrically connected to the first supply voltage $V_1$.

The first control signal CTL1 can be used to control the switch configuration of the input chopping switch bank 11. Additionally, the second control signal CTL2 can be used to control the switch configuration of the first output chopping switch bank 12a, and the third control signal CTL3 can be used to control the switch configuration of the second output chopping switch bank 12b. The first control signal CTL1, the second control signal CTL2, and the third control signal CTL3 can be generated by a programmable memory, such as the programmable memory 9 of FIGS. 1A and 1B.

Although FIG. 4A illustrates a configuration including three chopping switch banks, the teachings herein are applicable to configurations using more or fewer chopping switch banks, including, for example, configurations including one chopping switch bank. However, including a plurality of chopping switch banks can aid in further reducing a chopper amplifier's residual charge-injection-related errors relative to a single bank configuration.

Absent correction, a chopper amplifier can have residual charge-injection-related errors, which can be caused in part by charge injection mismatch from clock signal lines to the signal path. For example, residual charge-injection-related errors can result from a mismatch between charge injected from a clock signal node to the amplifier's non-inverted input terminal relative to charge injected from the clock signal node to the amplifier's inverted input terminal. Although layout techniques can mitigate mismatch, a chopper amplifier can nevertheless have residual charge-injection-related errors.

In the illustrated configuration, the input chopping switch bank 11, the first output chopping switch bank 12a, and the second output chopping switch bank 12b can be separately configured using the first control signal CTL1, the second control signal CTL2, and the third control signal CTL3, respectively, to calibrate the amplifier with low residual input offset voltage or low differential input current. For example, during device fabrication, each switch in the input chopping switch banks can incur a random mismatch. The effect of this mismatch may vary with operating point. The total charge injection imbalance of bank can be equal to a sum of the charge injection of the switches allocated to a first group, minus a sum of the charge injection of switches allocated to a second group. In the illustrated configuration, the residual differential input current and/or residual input offset voltage of the chopper amplifier 50 can be observed for different settings of the first control signal CTL1, the second control signal CTL2, and the third control signal CTL3. Additionally, the chopper amplifier 50 can be programmed to operate with the selected switch configurations of the switch banks to provide the amplifier with low residual differential input current and/or low residual input offset voltage.

Although the chopper amplifier 50 of FIG. 4A illustrates one example of a chopper amplifier that can include a switch bank, the teachings herein are applicable to a wide variety of chopper amplifiers, including, for example, chopper amplifiers implemented using other circuit topologies. Additionally, the teachings herein are application to other configurations of amplifiers, including, for example, auto-zero amplifiers or amplifiers that combine auto-zeroing and chopping.

Figure 4B:
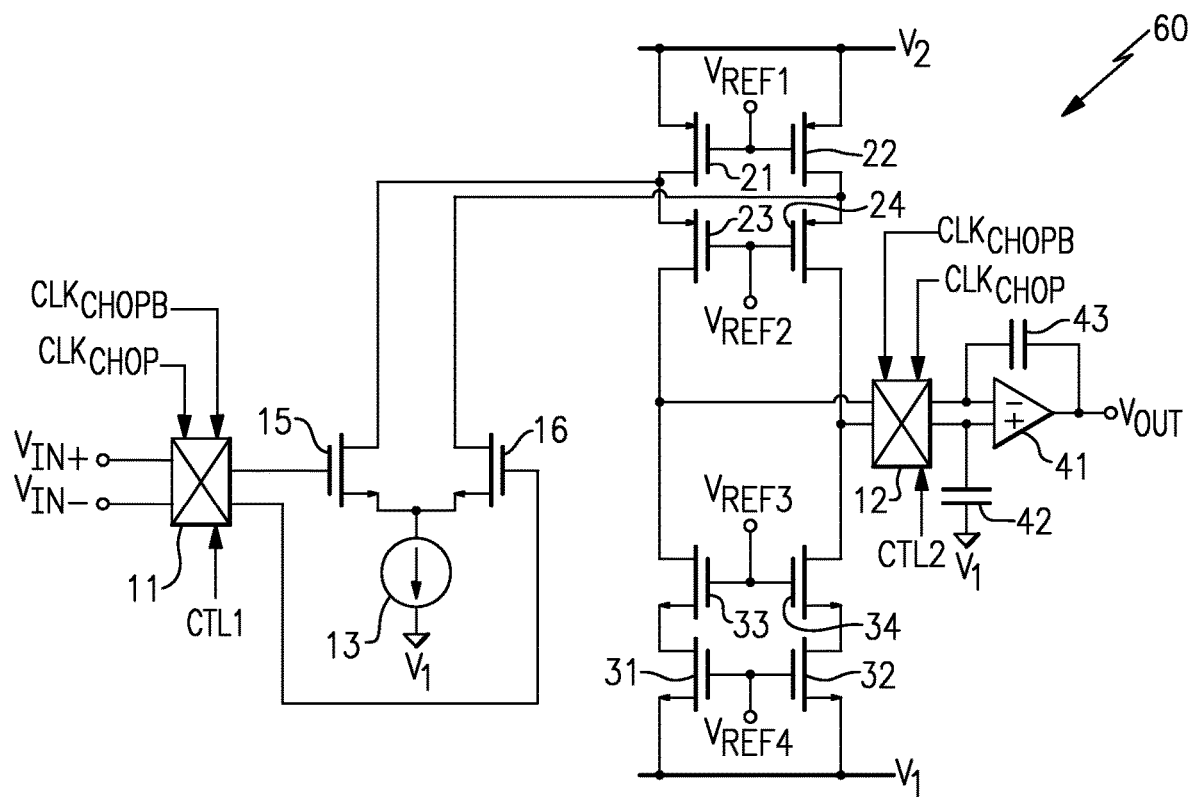
FIG. 4B is a circuit diagram of a chopper amplifier according to another embodiment.

FIG. 4B is a circuit diagram of a chopper amplifier 60 according to another embodiment. The chopper amplifier 60 of FIG. 4B is similar to the chopper amplifier 50 of FIG. 4A, except that the chopper amplifier 60 illustrates a different configuration of output chopping circuitry. For example, in contrast to the chopper amplifier 50 of FIG. 4A that includes the first and second output chopping switch banks 12a, 12b, the chopper amplifier 60 includes an output chopping switch bank 12.

As shown in FIG. 4B, the output chopping switch bank 12 includes a first input terminal electrically connected to the drain of the first PMOS cascode transistor 23 and to the drain of the first NMOS cascode transistor 33, a second input terminal electrically connected to the drain of the second PMOS cascode transistor 24 and to the drain of the second NMOS cascode transistor 34, a first output terminal electrically connected to the inverting input of the output amplification circuit 41 and to the first end of the feedback capacitor 43, and a second output terminal electrically connected to the non-inverting input of the output amplification circuit 41 and to the first end of the integration capacitor 42. Additionally, the output chopping switch bank 12 further includes a first clock terminal that receives the inverted chopping clock signal $CLK_{CHOPB}$, a second clock terminal that receives the non-inverted chopping clock signal $CLK_{CHOP}$, and a control terminal that receives a second control signal CTL2.

The teachings herein are applicable to a wide variety of input and output chopping switch configurations. For example, a chopper amplifier can include multiple input and/or output chopping switches. Additionally, in certain configurations, one or more of the input and/or output chopping switches can receive different clock signals, such as clock signals with different delays, overlaps, non-overlaps, and/or phases.

Additional details of the chopper amplifier 60 can be similar to those described earlier.

Figure 4C:
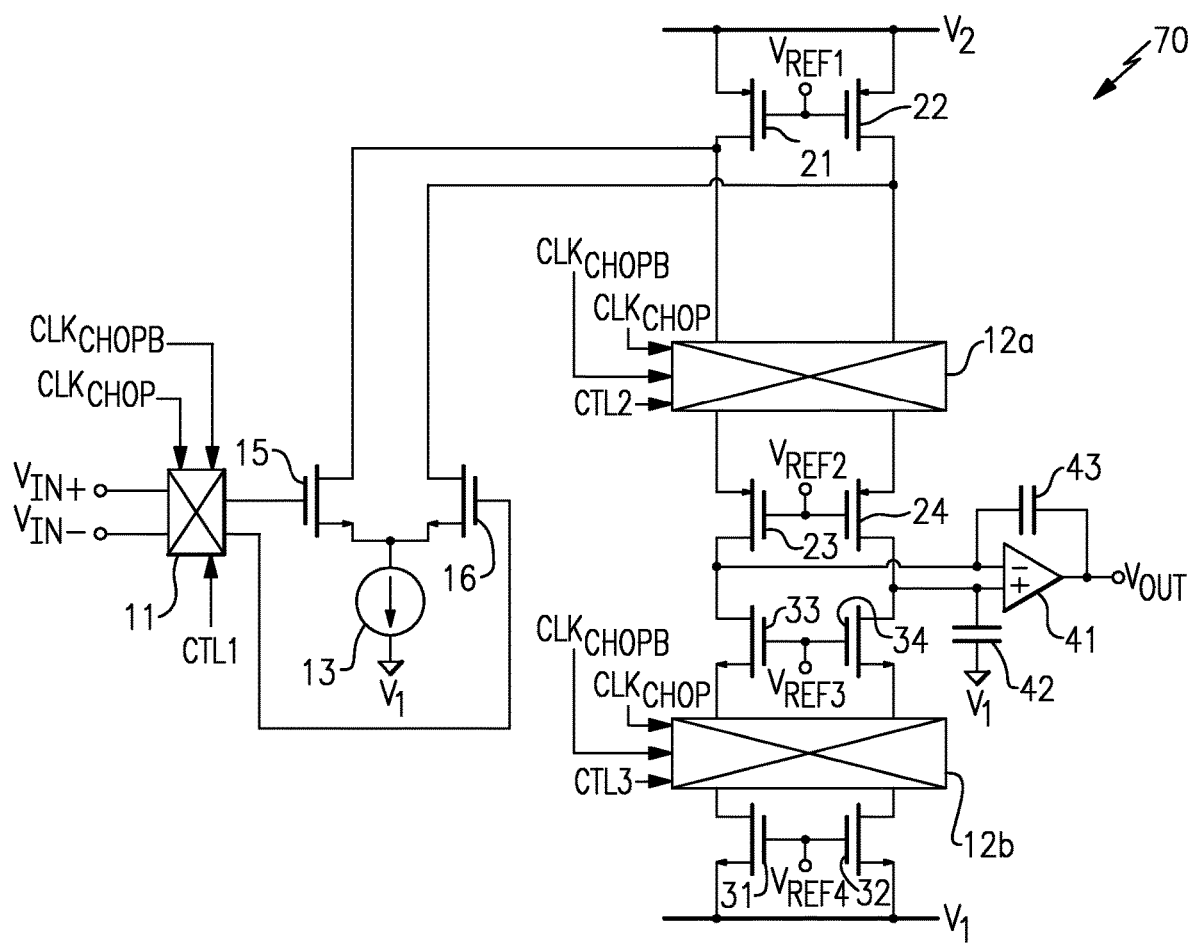
FIG. 4C is a circuit diagram of a chopper amplifier according to another embodiment.

FIG. 4C is a circuit diagram of a chopper amplifier 70 according to another embodiment. The chopper amplifier 70 of FIG. 4C is similar to the chopper amplifier 50 of FIG. 4A, except that the chopper amplifier 70 illustrates a different configuration of output chopping circuitry.

For example, relative to the chopper amplifier 50 of FIG. 4A, the chopper amplifier 70 of FIG. 4C illustrates a configuration in which the order of the first output chopping switch bank 12a and the first and second PMOS cascode transistors 23, 24 is flipped or reversed. Additionally, relative to the chopper amplifier 50 of FIG. 4A, the chopper amplifier 70 of FIG. 4C illustrates a configuration in which the order of the second output chopping switch bank 12b and the first and second NMOS cascode transistors 33, 34 is flipped or reversed.

The teachings herein are applicable to a wide variety of input and output chopping switch configurations, and FIG. 4C illustrates yet another example chopping switch configuration. However, other configurations are possible.

Figure 5A:
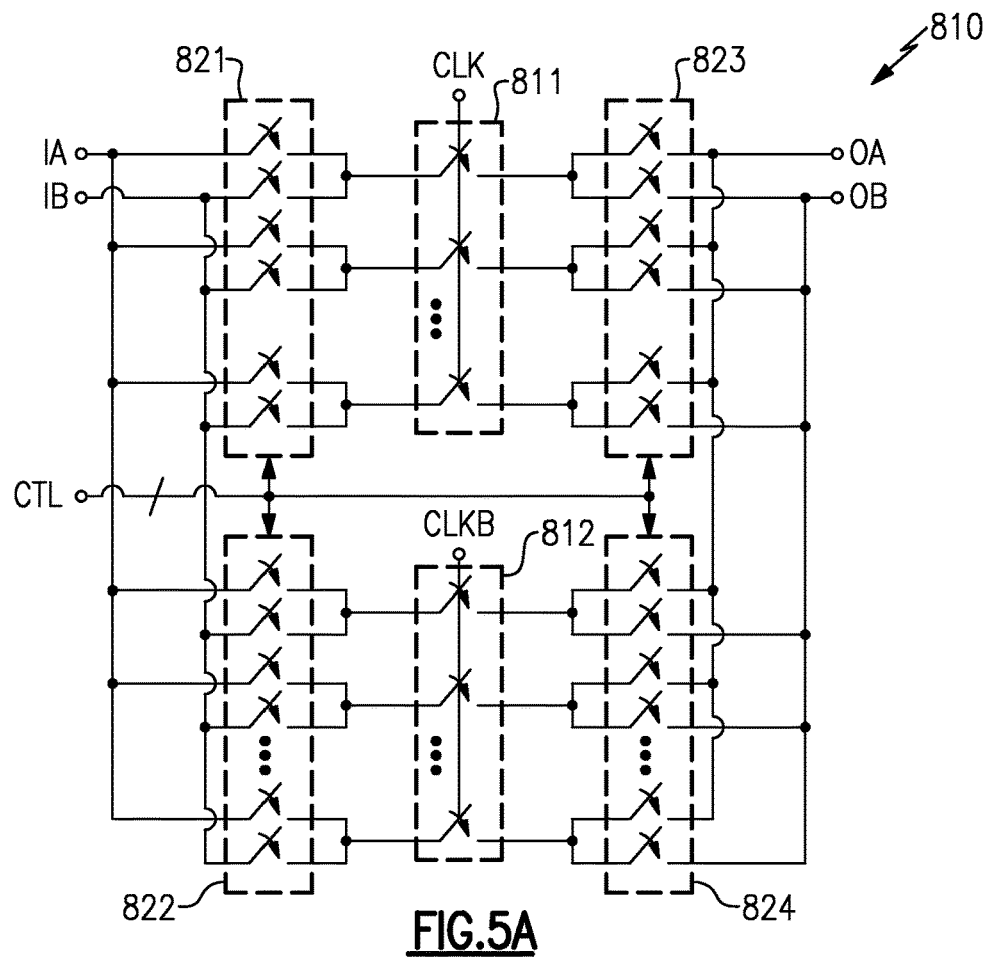
FIG. 5A is a circuit diagram of a chopping switch bank according to one embodiment.

FIG. 5A is a circuit diagram of a chopping switch bank 810 according to one embodiment. The chopping switch bank 810 includes a first input terminal IA, a second input terminal IB, a first output terminal OA, a second output terminal OB, a first clock terminal CLK, a second clock terminal CLKB, and a control terminal CTL.

Although the chopping switch bank 810 of FIG. 5A illustrates one example of a chopping switch bank, the teachings herein are applicable a wide variety of chopping switch bank configurations.

The chopping switch bank 810 further includes a first plurality of clock-controlled switches 811, a second plurality of clock-controlled switches 812, a first plurality of input selection switches 821, a second plurality of input selection switches 822, a first plurality of output selection switches 823, and a second plurality of output selection switches 824. As shown in FIG. 5A, the first plurality of clock-controlled switches 811 include clock inputs that receive the first clock signal CLK and the second plurality of clock-controlled switches 812 include clock inputs that receive the second clock signal CLKB.

In the illustrated configuration, the input selection switches 821, 822 and the output selection switches 823, 824 collectively operate as a selection circuit, which controls the electrical connectivity of the first plurality of clock-controlled switches 811a and the second plurality of clock-controlled switches 812. For example, in certain configurations, the input selection switches 821, 822 and the output selection switches 823, 824 can be used to electrically connect a particular clock-controlled switch between the first input terminal IA and the first output terminal OA, between the first input terminal IA and the second output terminal OB, between the second input terminal IB and the first output terminal OA, or between the second input terminal IB and the second output terminal OB. Thus, the input selection switches 821, 822 and the output selection switches 823, 824 can be used, for example, to place any given clock-controlled switch in one of four switch groups.

Although a specific number of clock-controlled switches and selection switches are illustrated in FIG. 5A, the example is merely illustrative, and the chopping switch bank can include more or fewer clock-controlled switches and/or selection switches.

Figure 5B:
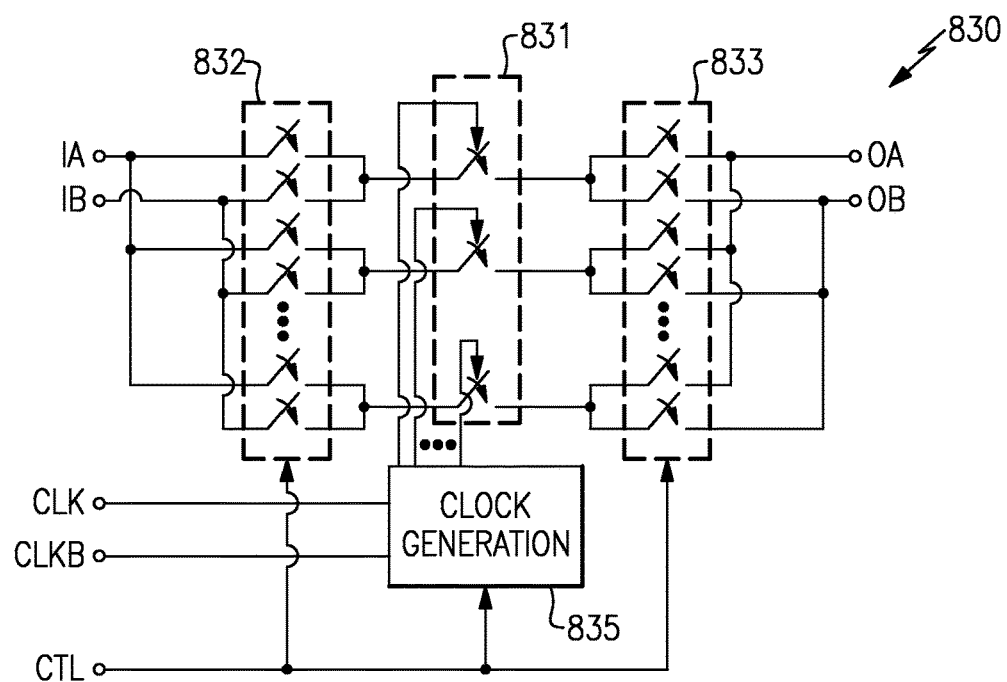
FIG. 5B is a circuit diagram of a chopping switch bank according to one embodiment.

FIG. 5B is a circuit diagram of a chopping switch bank 830 according to another embodiment. The chopping switch bank 830 includes a first input terminal IA, a second input terminal IB, a first output terminal OA, a second output terminal OB, and a first clock terminal CLK, a second clock terminal CLKB, and a control terminal CTL.

The chopping switch bank 810 further includes a plurality of clock-controlled switches 831, a plurality of input selection switches 832, a plurality of output selection switches 833, and a clock generation circuit 835.

In the illustrated configuration, the input selection switches 832, the output selection switches 833, and the clock generation circuit 835 collectively operate as a selection circuit. The input selection switches 832 and the output selection switches 833 can be used to control the electrical connectivity of the clock-controlled switches 831. For example, in certain configurations, the input selection switches 832 and the output selection switches 833 can be used to electrically connect a particular clock-controlled switch between the first input terminal IA and the first output terminal OA, between the first input terminal IA and the second output terminal OB, between the second input terminal IB and the first output terminal OA, or between the second input terminal IB and the second output terminal OB. Thus, the input selection switches 832 and the output selection switches 833 can be used, for example, to place any given clock-controlled switch in one of four switch groups. Additionally, the clock generation circuit 835 can be used to control a clock signal that is provided to a particular clock-controlled switch. For example, in certain embodiments, the clock generation circuit 835 can include logic circuitry and/or multiplexers used to selectively provide the first clock signal CLK or the second clock signal CLKB to each of the clock-controlled switches 831.

Although the chopping switch banks 810 and 830 of FIGS. 5A-B illustrate two examples of chopping switch banks, the teachings herein are applicable a wide variety of chopping switch bank configurations.

Figure 6:
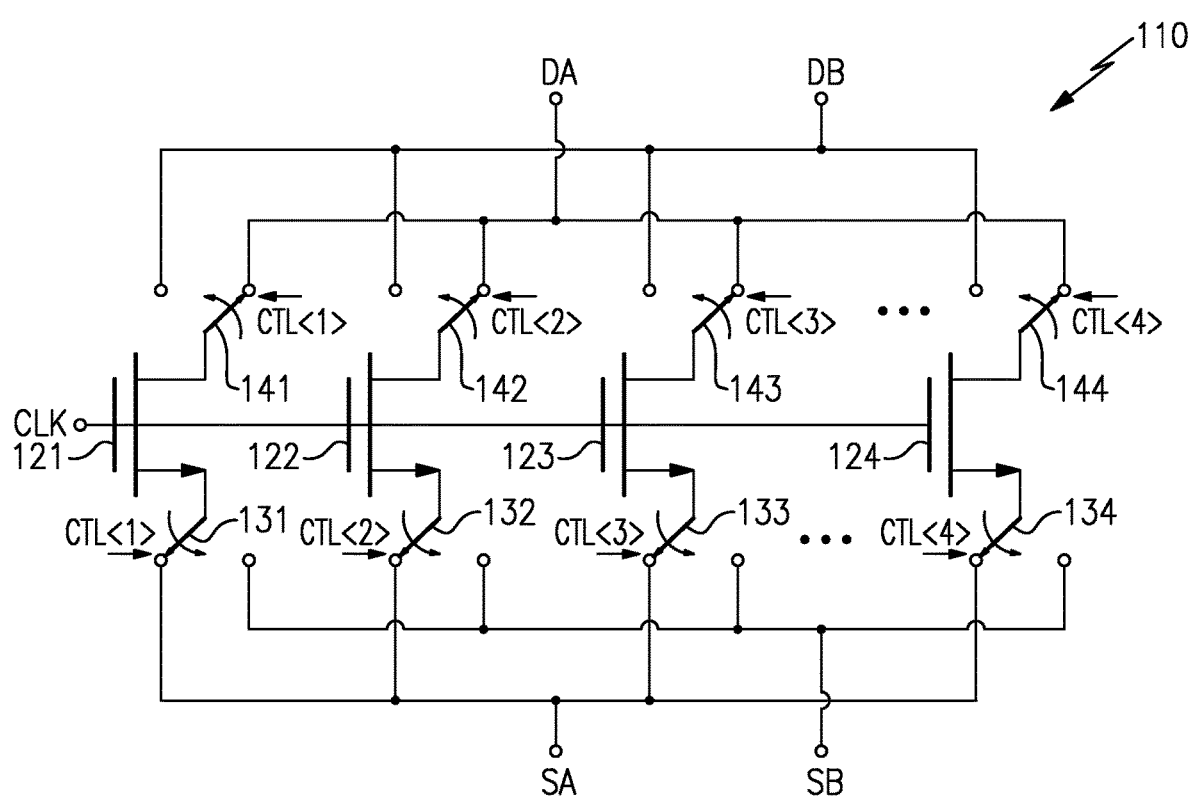
FIG. 6 is a circuit diagram of a switch transistor bank according to one embodiment.

FIG. 6 is a circuit diagram of a switch transistor bank 110 according to one embodiment. The switch transistor bank 110 includes a first source or input terminal SA, a second source terminal SB, a first drain or output terminal DA, a second drain terminal DB, a clock terminal CLK, and a control terminal associated with first to fourth control bits CTL<1>, CTL<2>, CTL<3>, CTL<4>, respectively.

The switch transistor bank 110 further includes first to fourth NMOS transistors 121-124, first to fourth source selection switches 131-134, and first to fourth drain selection switches 141-144. Although illustrated as including four transistors and corresponding selection switches, the teachings herein are applicable to configurations including n transistors. In one embodiment n is selected to be in the range of about 4 and about 24 transistors.

In the illustrated configuration, the first to fourth source selection switches 131-134 and the first to fourth drain selection switches 141-144 operate as a selection circuit that can be controlled using different bits of a control signal. For example, the control signal's bits can be used to selectively connect the drains of the first to fourth NMOS transistors 121-124 to either the first drain terminal DA or the second drain terminal DB, and to selectively connect the sources of the first to fourth NMOS transistors 121-124 to either the first source terminal SA or the second source terminal SB. As shown in FIG. 6, the gates of the first to fourth NMOS transistors 121-124 are electrically connected to the clock terminal CLK.

In certain implementations, the first to fourth NMOS transistors 121-124 are designed with the same drive-strength and/or geometry.

The first to fourth source selection switches 131-134 and the first to fourth drain selection switches 141-144 can be used to electrically connect a first portion of the NMOS transistors 121-124 to the first drain terminal DA and the first source terminal SA, and to electrically connect a second portion of the NMOS transistors 121-124 to the second drain terminal DB and the second source terminal SB. In certain implementations, the selected configuration of transistors can be determined during factory test and can be retained in an on-chip programmable memory.

Although FIG. 6 illustrates a switch bank implemented using NMOS transistors, the teachings herein are applicable to configuration using p-type transistors, or a combination of n-type and p-type transistors.

Figure 7:
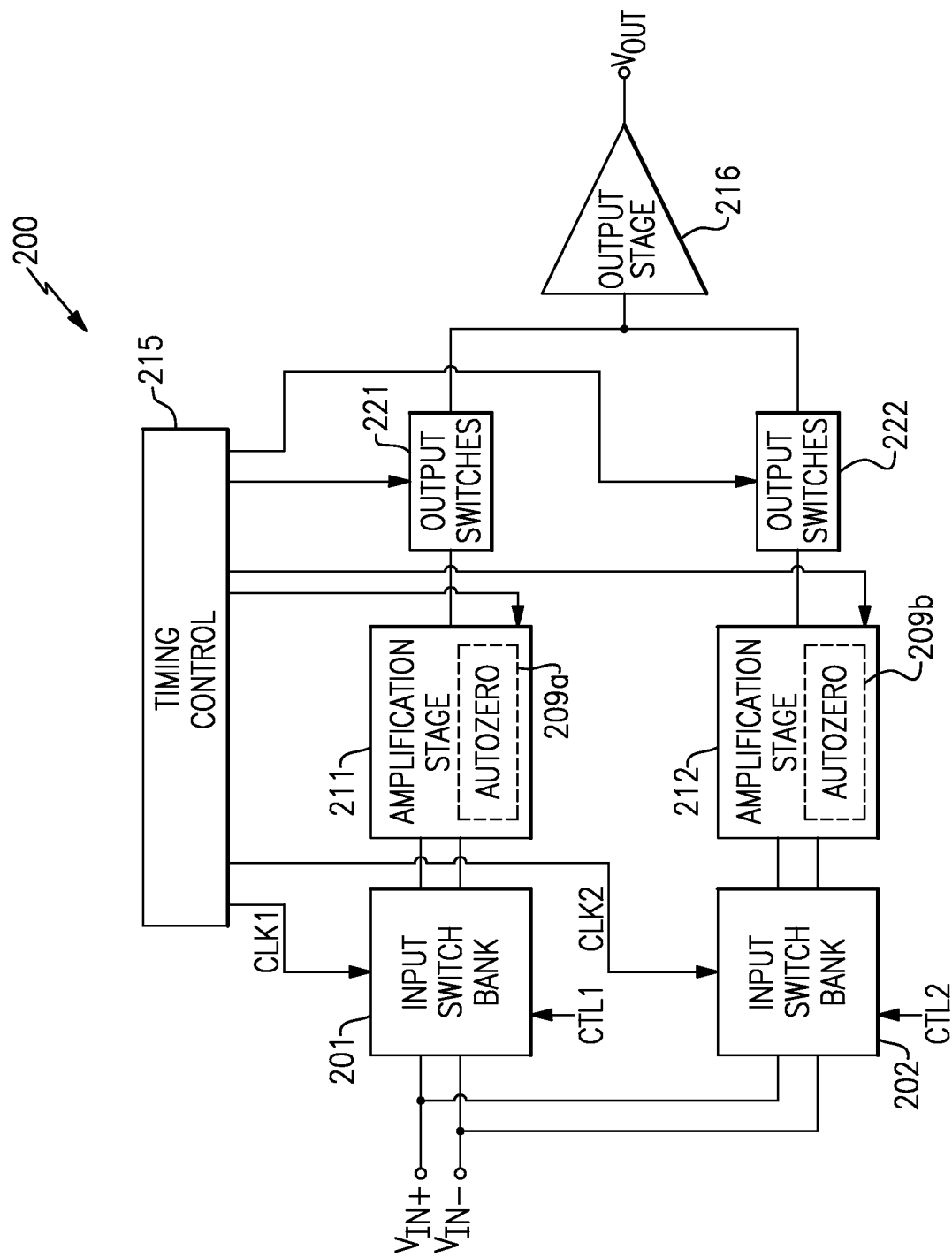
FIG. 7 is a schematic diagram of an auto-zero amplifier according to one embodiment.

FIG. 7 is a schematic diagram of an auto-zero amplifier 200 according to one embodiment. The auto-zero amplifier 200 includes a first input switch bank 201, a second input switch bank 202, a first amplification stage 211, a second amplification stage 212, first output switches 221, second output switches 222, a timing control circuit 215, and an output stage 216. The auto-zero amplifier 200 further includes a non-inverting input voltage terminal $V_{IN+}$, an inverting input voltage terminal $V_{IN-}$, and an output voltage terminal $V_{OUT}$.

The first input switch bank 201 includes a first input terminal electrically connected to the non-inverting input voltage terminal $V_{IN+}$, a second input terminal electrically connected to the inverting input voltage terminal $V_{IN-}$, a first output terminal electrically connected to a non-inverting input of the first amplification stage 211, and a second output terminal electrically connected to an inverting input of the first amplification stage 211. The first input switch bank 201 further includes a clock terminal that receives a first clock signal CLK1 and a control terminal that receives a first control signal CTL1. The first amplification stage 211 further includes a first auto-zero circuit 209a, which can be controlled using a first auto-zero control signal generated by the timing control circuit 215. The first output switches 221 include an input terminal electrically connected to an output of the first amplification stage 211, a clock terminal that receives a third clock signal from the timing control circuit 215, and an output terminal electrically connected to an input of the output stage 216. The output stage 216 further includes an output electrically connected to the output voltage terminal $V_{OUT}$.

The second input switch bank 202 includes a first input terminal electrically connected to the non-inverting input voltage terminal $V_{IN+}$, a second input terminal electrically connected to the inverting input voltage terminal $V_{IN-}$, a first output terminal electrically connected to a non-inverting input of the second amplification stage 212, and a second output terminal electrically connected to an inverting input of the second amplification stage 212. The second input switch bank 202 further includes a clock terminal that receives a second clock signal CLK2 and a control terminal that receives a second control signal CTL2. The second amplification stage 212 further includes a second auto-zero circuit 209b, which can be controlled using a second auto-zero control signal generated by the timing control circuit 215. The second output switches 222 include an input terminal electrically connected to an output of the second amplification stage 212, a clock terminal that receives a fourth clock signal from the timing control circuit 215, and an output terminal electrically connected to an input of the output stage 216.

The illustrated auto-zero amplifier 200 is implemented in a ping-pong configuration, in which the first amplification stage 211 provides amplification while the second amplification stage 212 is being auto-zeroed, and in which the second amplification stage 212 provides amplification while the first amplification stage 211 is being auto-zeroed. By configuring the amplifier 200 in this manner, the amplifier can provide amplification even when an amplification stage is being auto-zeroed to reduce the amplifier's input offset voltage. Additional details of ping-pong auto-zeroing can be as described in commonly-owned U.S. Pat. No. 6,476,671, issued Nov. 5, 2002, and titled "PING-PONG AMPLIFIER WITH AUTO-ZEROING AND CHOPPING."

When the first amplification stage 211 is being auto-zeroed, the timing control circuit 215 can disconnect the first amplification stage 211 from the amplifier's signal path. For instance, the timing control circuit 215 can control the first input switch bank 201 and the first output switches 221 to disconnect the first amplification stage 211. Similarly, when the second amplification stage 212 is being auto-zeroed, the timing control circuit 215 can disconnect the second amplification stage 212 from the amplifier's signal path using the second input switch bank 202 and the second output switches 222. In certain configurations, the first input switch bank 201 can also be used to electrically connect the first amplification stage's non-inverting input and inverting input to one another when the first amplification stage 211 is being auto-zeroed, and the second input switch bank 202 can also be used to electrically connect the second amplification stage's non-inverting input and inverting input to one another when the second amplification stage 212 is being auto-zeroed.

In the illustrated configuration, the first and second input switch banks 201, 202 are implemented as switch banks controlled using first and second control signals CTL1, CTL2, respectively. The first control signal CTL1 can be used to configure the first input switch bank 201 with a particular configuration of switches coupled between the bank's first input terminal and first output terminal and between the bank's second input terminal and second output terminal. Additionally, the second control signal CTL2 can be used to configure the second input switch bank 202 with a particular configuration of switches coupled between the bank's first input terminal and first output terminal and between the bank's second input terminal and second output terminal.

Additional details of the auto-zero amplifier 200 can be similar to those described earlier.

Although the auto-zero amplifier 200 of FIG. 7 illustrates one example of an auto-zero amplifier that can include one or more switch banks, the teachings herein are applicable a wide variety of auto-zero amplifiers, including, for example, auto-zero amplifiers implemented using other circuit topologies.

Figure 8:
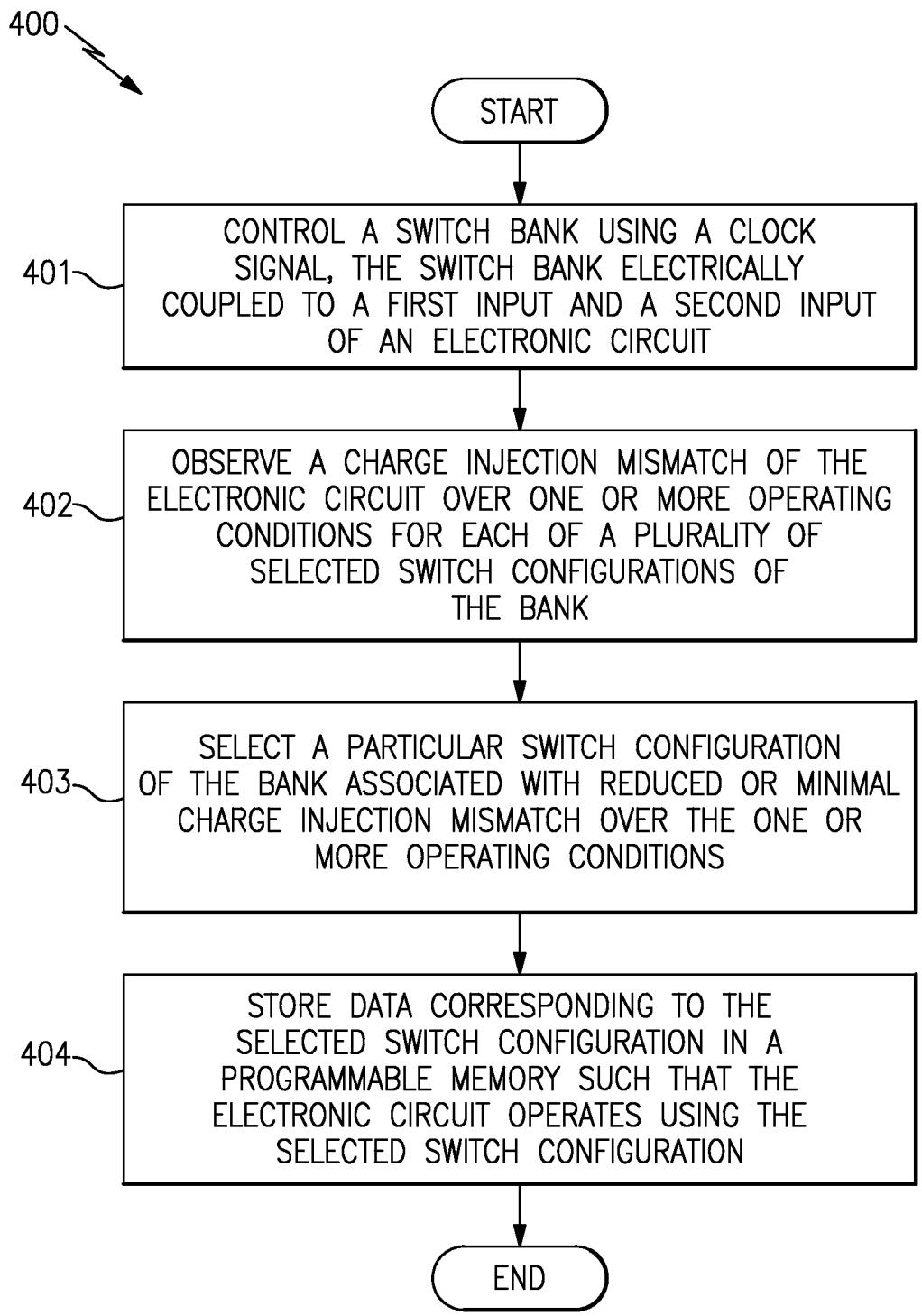
FIG. 8 is a flow diagram of a method of calibrating an electronic circuit according to one embodiment.

FIG. 8 is a flow diagram of a method 400 of calibrating an electronic circuit according to one embodiment. The method 400 can be used to calibrate, for example, any of the electronic circuits herein. It will be understood that the method may include greater or fewer operations.

The illustrated method 400 of calibrating an electronic circuit starts at block 401, in which a switch bank is controlled using a clock signal. The switch bank is electrically coupled to a first input and a second input of the electronic circuit.

The method 400 continues at block 402, in which a charge injection mismatch of the electronic circuit is observed over one or more operation conditions for each of a plurality of selected switch configurations of the switch bank.

In certain implementations, the electronic circuit's charge injection mismatch is determined at a plurality of operating conditions, including at two or more values of the same operating variable. Determining charge injection mismatch across multiple values of at least one operating variable can be used to determine how the charge injection mismatch varies across an operating range. For example, charge injection mismatch can vary or change with temperature, supply voltage, bias current, and common-mode input voltage. By determining the charge injection mismatch across two or more values of at least one operating variable, a switch configuration providing a relatively small charge injection mismatch can be selected.

In an ensuing block 403, a particular switch configuration of the switch bank having reduced or minimal charge injection mismatch over the one or more operating conditions is selected. In certain configurations, the selected switch configuration can correspond to a switch configuration having the smallest charge injection mismatch at a particular operating point. However, in other configurations, the selected switch configuration can correspond to a switch configuration associated with a relatively small change or variation of the charge injection mismatch across a plurality of operating conditions. For example, the selected switch configuration can correspond to a switch configuration in which the charge injection mismatch has about the smallest drift across changes in temperature, supply voltage, bias current, and/or common-mode input voltage The method 400 continues at a block 404, in which data corresponding to the selected switch configuration is stored in a programmable memory such that the electronic circuit operates with the selected switch configuration.

Figure 9:
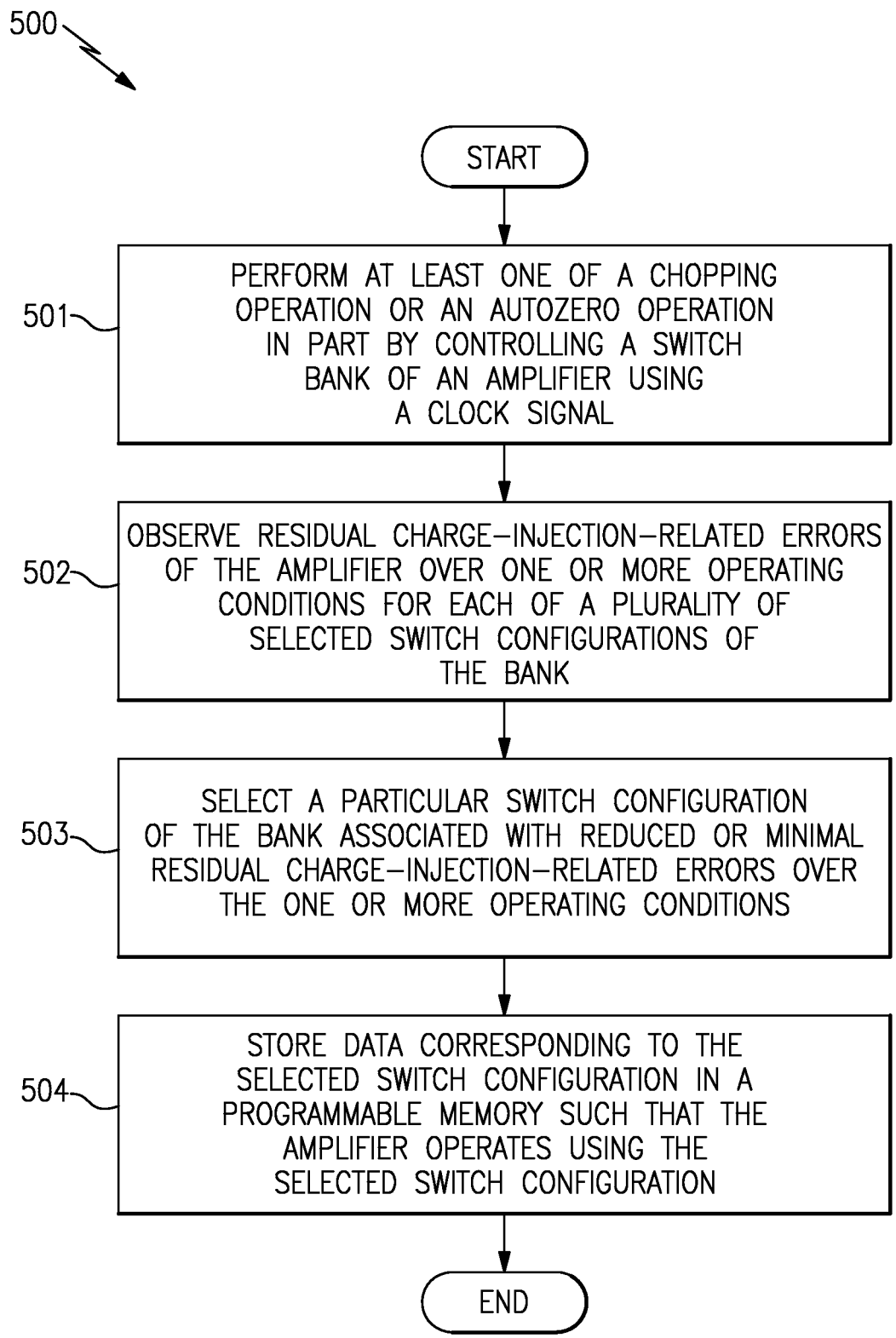
FIG. 9 is a flow diagram of a method of calibrating an amplifier according to one embodiment.

FIG. 9 is a flow diagram of a method 500 of calibrating an amplifier according to one embodiment. The method 500 can be used to calibrate, for example, any of the amplifiers herein. It will be understood that the method may include greater or fewer operations.

The illustrated method 500 of calibrating an amplifier starts at block 501, in which at least one of an auto-zero operation or chopping operation is performed on an amplifier in part by controlling a switch bank of the amplifier using a clock signal.

The method 500 continues at block 502, in which residual charge-injection-related errors of an amplifier are observed over one or more operating conditions for each of a plurality of selected switch configurations of the switch bank. The amplifier's residual charge-injection-related errors can be determined in a variety of ways, including, for example, by determining a voltage difference between the amplifier's non-inverting and inverting input terminals, or an amplified version thereof, when the amplifier is connected using negative feedback. In certain implementations, such a voltage difference can be observed with the clock signals used to control the switch bank operating in steady-state conditions.

In certain implementations, the amplifier's residual charge-injection-related errors are determined at a plurality of operating conditions, including at two or more values of the same operating variable. Determining the amplifier's residual charge-injection-related errors across multiple values of at least one operating variable can be used to determine how the quantity varies across an operating range. For example, an amplifier's residual input offset voltage can vary or change with temperature, supply voltage, bias current, and common-mode input voltage. By determining the residual input offset voltage across two or more values of at least one operating variable, a switch configuration providing a relatively small input offset variation can be selected.

Although the method 500 is illustrated for the case of an amplifier including one switch bank, the amplifier can include multiple switch banks, and the residual charge-injection-related errors of the amplifier can be determined for each selected switch configuration of the banks. In certain implementations, the amplifier's residual charge-injection-related errors are determined for different switch configurations of one of the multiple switch banks while the other switch banks are in a fixed switch configuration. Once a particular switch bank has been configured, the method can be repeated until all switch banks are configured. In other implementations, residual charge-injection-related errors are determined when changing the switch configurations of two or more of the multiple switch banks.

In an ensuing block 503, a particular switch configuration of the switch bank having reduced or minimal residual charge-injection-related errors over the one or more operating conditions is selected. In certain configurations, the selected switch configuration can correspond to a switch configuration having the smallest residual charge-injection-related errors at a particular operating point. However, in other configurations, the selected switch configuration can correspond to a switch configuration associated with a relatively small change or variation of the residual charge-injection-related errors across a plurality of operating conditions. For example, the selected switch configuration can correspond to a switch configuration in which the amplifier's residual input offset voltage has about the smallest drift across changes in temperature, supply voltage, bias current, and/or common-mode input voltage. In one embodiment, the selected switch configuration corresponds to a switch configuration having about the smallest mean square error over the range of operating conditions.

The method 500 continues at a block 504, in which data corresponding to the selected switch configuration is stored in a programmable memory such that the amplifier operates with the selected switch configuration.

In certain implementations, the programmable memory is a non-volatile memory integrated on-chip or in a common package with the amplifier, and the non-volatile memory is programmed with the data during factory test.

However, other configurations are possible, such as implementations in which the amplifier is calibrated during power-on and/or during a calibration cycle.

Figure 10:
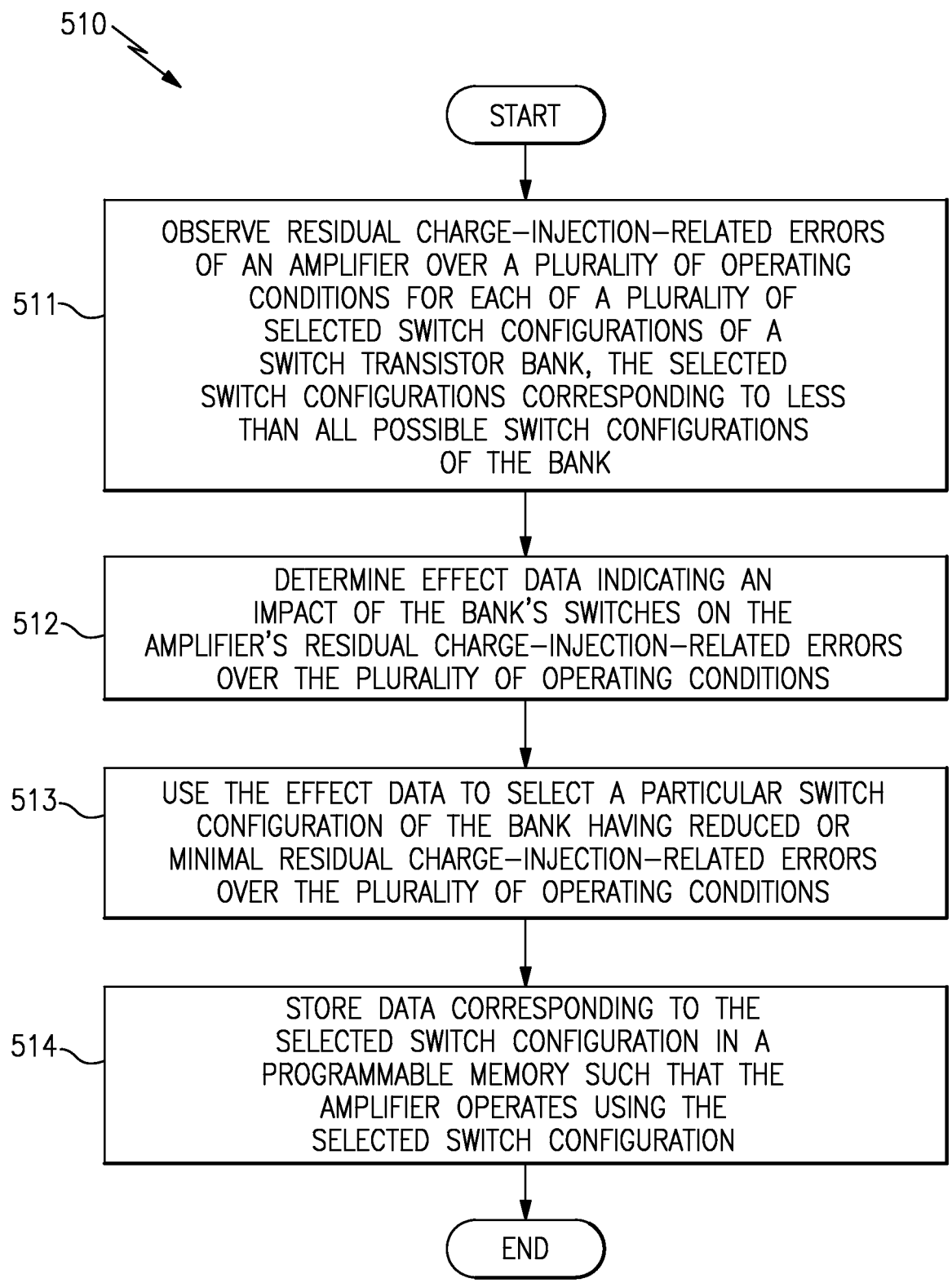
FIG. 10 is a flow diagram of a method of calibrating an amplifier according to another embodiment.

FIG. 10 is a flow diagram of a method 510 of calibrating an amplifier according to another embodiment. The method 510 can be used to calibrate, for example, any of the amplifiers herein. It will be understood that the method may include greater or fewer operations.

The illustrated method 510 of calibrating an amplifier starts at block 511, in which residual charge-injection-related errors of the amplifier are observed over a plurality of operating conditions for each of a plurality of selected switch configurations of a switch bank, where the selected switch configurations correspond to less than all possible switch configurations of the switch bank.

The amplifier's residual charge-injection-related errors can be observed in a variety of ways, and can be observed across a plurality of operating conditions including at two or more values or a sweep of at least one operating variable.

In the illustrated method 510, the residual charge-injection-related errors are observed for less than all possible switch configurations of the switch bank. By observing the residual charge-injection-related errors for less than all possible switch configurations, the calibration time of the amplifier can be reduced. In one embodiment, residual charge-injection-related errors are observed for a plurality of linearly independent switch configurations.

The method 510 continues at a block 512, in which effect data indicating an impact of the bank's switches on the residual charge-injection-related errors over the plurality of operating conditions is determined. In certain configurations herein, a contribution of each switch as a vector can be solved. Additionally, each switch's contribution can be further decomposed into several effects, which themselves can be vectors. In certain configurations, one or more effects can be selectively minimized or reduced. In one embodiment, the effect data includes a plurality of vectors comprising data representing an impact of the plurality of switches on the residual charge-injection-related errors for each of the plurality of operating conditions.

In an ensuing block 513, the effect data is used to select a particular configuration of the switch bank having reduced or minimal charge-injection-related errors over the plurality of operating conditions. The selected switch configuration of the switch bank can correspond to one of the switch configurations for which the amplifier's residual charge-injection-related errors were observed or to a switch configuration for which the amplifier's residual charge-injection-related errors were not observed. In certain implementations, the selected switch configuration is selected by computing a linear combination of different combinations of the vectors of the effect data, and determining the linear combination that has the smallest mean square length.

The method 510 can be used to select a switch configuration that provides low charge-injection-related errors across multiple operating points, such as temperature, supply voltage, bias current, and/or common-mode input voltage. The method 510 can involve less calibration time relative to a scheme in which an amplifier's residual charge-injection-related errors are observed for every switch configuration of a switch bank.

The method 510 continues at a block 514, in which data corresponding to the selected switch configuration is stored in a programmable memory such that the amplifier operates with the selected switch configuration.

Additional details of the method 510 of FIG. 10 can be similar to those described earlier for the method 500 of FIG. 9.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, medical imaging and monitoring, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus that is programmable to compensate for charge injection mismatch arising from manufacturing variation, the apparatus comprising:
a programmable memory configured to generate a first control signal;
a switch bank configured to receive a first input signal at a first input terminal and a second input signal at a second input terminal, wherein the switch bank is further configured to generate a first output signal at a first output terminal and a second output signal at a second output terminal, wherein the switch bank comprises a selection circuit and a plurality of switches; and
an electronic circuit including a first input configured to receive the first output signal from the switch bank and a second input configured to receive the second output signal from the switch bank,
wherein the selection circuit is configured to select a first portion of the plurality of switches for operation in a first switch group based on a non-periodic setting provided by the first control signal, wherein the selection circuit is further configured to select a second portion of the plurality of switches for operation in a second switch group based on the non-periodic setting provided by the first control signal, wherein the first switch group is configured to operate in a first signal path between the first input terminal and the first output terminal of the switch bank, wherein the second switch group is configured to operate in a second signal path between the second input terminal and the second output terminal of the switch bank, and wherein the first switch group and the second switch group are controllable by a first clock signal.

2. The apparatus of claim 1, wherein the programmable memory comprises data stored therein, wherein the data is associated with a selected non-periodic setting provided by the first control signal, wherein the selected non-periodic setting provided by the first control signal corresponds to a particular switch configuration of the plurality of switches in the first and second switch groups having a smaller charge injection mismatch as compared to at least a second setting provided by the first control signal.

3. The apparatus of claim 1, wherein absent manufacturing variation, at least one of a drive-strength or a geometry of each of the plurality of switches is substantially the same.

4. The apparatus of claim 1, wherein the selection circuit is configured to select an equal number of switches in the first and second switch groups.

5. The apparatus of claim 1, further comprising an integrated circuit (IC), wherein the IC comprises the programmable memory, the switch bank, and the electronic circuit.

6. The apparatus of claim 1, wherein the plurality of switches comprises a plurality of field-effect transistors.

7. The apparatus of claim 1, wherein the electronic circuit comprises an amplification circuit, wherein a voltage difference between the first input signal and the second input signal comprises a differential input voltage signal.

8. The apparatus of claim 7, wherein the apparatus further comprises at least one of chopping circuitry or auto-zero circuitry that comprises the switch bank, wherein the programmable memory comprises data stored therein, wherein the data is associated with a selected non-periodic setting provided by the first control signal, wherein the selected non-periodic setting provided by the first control signal corresponds to a particular switch configuration of the plurality of switches in the first and second switch groups having smaller residual charge-injection-related errors of the switch bank as compared to at least a second non-periodic setting provided by the first control signal.

9. The apparatus of claim 8, wherein the selected non-periodic setting provided by the first control signal corresponds to a particular switch configuration of the plurality of switches in the first and second switch groups having minimum residual charge-injection-related errors as compared to all other settings of the first control signal.

10. The apparatus of claim 7, wherein the switch bank comprises an input chopping switch bank, wherein the input chopping switch bank is configured to chop the differential input voltage signal based on the first clock signal.

11. The apparatus of claim 10, wherein the selection circuit is configured to select a third portion of the plurality of switches for operation in a third switch group based on the non-periodic setting provided by the first control signal, wherein the selection circuit is further configured to select a fourth portion of the plurality of switches for operation in a fourth switch group based on the non-periodic setting provided by the first control signal, wherein the third switch group is configured to operate in a third signal path between the first input terminal and the second output terminal of the switch bank, wherein the fourth switch group is configured to operate in a fourth signal path between the second input terminal and the first output terminal of the switch bank, and wherein the third switch group and the fourth switch group are controllable by a second clock signal.

12. The apparatus of claim 10, further comprising at least one output chopping switch bank, wherein a switch configuration of a first output chopping switch bank of the at least one output chopping switch bank is controlled based on a non-periodic setting provided by a second control signal from the programmable memory.

13. The apparatus of claim 7, further comprising a timing control circuit, wherein the timing control circuit is configured to auto-zero the amplification circuit in part by controlling the switch bank using the first clock signal.

14. The apparatus of claim 7, wherein the amplification circuit comprises:
a first input field-effect transistor (FET) including a gate configured to operate as the first input of the electronic circuit;
a second input FET including a gate configured to operate as the second input of the electronic circuit and a source electrically connected to a source of the first input FET; and
a current source configured to generate a bias current of the first and second input FETs.

15. The apparatus of claim 14, wherein the amplification circuit further comprises:
an output amplification stage comprising an inverting input, a non-inverting input, and an output configured to generate an output signal of the amplification circuit;
a first load FET including a drain electrically connected to a drain of the first input FET;
a second load FET including a drain electrically connected to a drain of the second input FET; and
a first output chopping switch bank comprising a first output selection circuit and a first plurality of output switches, wherein the first output selection circuit is configured to select a first portion of the first plurality of output switches for operation in a third signal path between the drain of the first load FET and the inverting input of the output amplification stage, wherein the first output selection circuit is further configured to select a second portion of the first plurality of output switches for operation in a fourth signal path between the drain of the second load FET and the non-inverting input of the output amplification stage, wherein the first output selection circuit is further configured to select a third portion of the first plurality of output switches for operation in a fifth signal path between the drain of the first load FET and the non-inverting input of the output amplification stage, wherein the first output selection circuit is further configured to select a fourth portion of the first plurality of output switches for operation in a sixth signal path between the drain of the second load FET and the inverting input of the output amplification stage, and wherein the first output selection circuit selects the first, second, third, and fourth portions of the first plurality of output switches based on a non-periodic setting provided by a second control signal from the programmable memory.

16. A method of reducing charge injection mismatch arising from manufacturing variation of an integrated circuit (IC), the method comprising:
controlling a switch bank using a first clock signal, the switch bank electrically coupled to a first input and a second input of an electronic circuit;
observing a charge injection mismatch of the electronic circuit for various non-periodic settings of the switch bank, wherein the switch bank comprises a plurality of switches, and wherein the various non-periodic settings comprise different combinations of the plurality of switches in a first switch group and in a second switch group;
choosing a switch configuration based on the observations of the charge injection mismatch, wherein the chosen switch setting corresponds to a particular combination of transistors in the first switch group and in the second switch group; and
in a programmable memory, storing data corresponding to the chosen switch setting such that the electronic circuit operates using the selected non-periodic switch setting.

17. The method of claim 16, further comprising:
retrieving the stored data at turn-on of the IC; and
applying the stored data such that the electronic circuit operates with the chosen switch setting.

18. The method of claim 16, wherein storing data corresponding to the chosen switch setting comprises programming a non-volatile memory.

19. The method of claim 16, wherein the electronic circuit comprises an amplification circuit,
wherein controlling the switch bank using the first clock signal comprises performing at least one of a chopping operation or an auto-zero operation of the amplification circuit in part by controlling the switch bank using the first clock signal,
wherein observing the charge injection mismatch comprises observing residual charge-injection-related errors of the amplification circuit for each of the plurality of selected switch settings of the switch bank, and
wherein the switch setting is chosen based on the observations of the residual charge-injection-related errors.

20. The method of claim 19, further comprising:
controlling a setting for an output switch bank of the amplification circuit using a second clock signal;
observing the residual charge-injection-related errors of the amplification circuit for each of a plurality of selected switch settings of the output switch bank of the amplification circuit; and
choosing a switch setting of the output switch bank based on the observations of the residual charge-injection-related errors.

21. The method of claim 19, wherein the selected switch settings further comprise a third switch group and a fourth switch group, the method further comprising controlling the third switch group and the fourth switch using a non-periodic setting provided by a second clock signal.

22. The method of claim 19, further comprising:
determining effect data for each switch of the switch bank using the observations of the residual charge-injection-related errors,
wherein the chosen switch setting is selected based at least partly on the effect data.

23. The method of claim 22, wherein the chosen switch setting is not from the plurality of selected switch settings.

24. The method of claim 22, further comprising observing the residual charge-injection-related errors of the amplification circuit for each of the plurality of selected switch settings for each of a plurality of operating conditions, wherein the plurality of operating conditions comprise two or more values of at least one operating variable.

25. The method of claim 24, wherein determining the effect data comprises determining a plurality of vectors comprising data representing an impact of the plurality of switches on the residual charge-injection-related errors for each of the plurality of operating conditions.

26. The method of claim 25, wherein choosing the particular combination further comprises determining a linear combination of the vectors having a smallest mean square length.

27. An amplifier that is programmable to compensate for charge injection mismatch arising from manufacturing variation, the amplifier comprising:
a programmable memory configured to generate a control signal;
a non-inverting input terminal and an inverting input terminal configured to receive a differential input signal;
a switch bank configured to receive the differential input signal and to generate a differential output signal, wherein the switch bank comprises a plurality of switches and a selection circuit that selects a first portion of the plurality of switches for operation in a first switch group based on a non-periodic setting provided by the control signal and that selects a second portion of the plurality of switches for operation in a second switch group based on the non-periodic setting provided by the control signal, wherein the first switch group and the second switch group are controllable by a clock signal; and
amplification circuitry comprising a non-inverting input and an inverting input configured to receive the differential output signal from the switch bank, wherein the first switch group operates in a first signal path between the non-inverting input terminal and the non-inverting input of the amplification circuitry, wherein the second switch group operates in a second signal path between the inverting input terminal and the inverting input of the amplification circuitry.

28. The apparatus of claim 1, wherein the switch bank further comprises a third switch group and a fourth switch group:
wherein the first switch group comprises a first pair of input selection switches, a first clock-controlled switch, and a first pair of output selection switches, wherein the first pair of input selection switches is controllable by the first control signal such that a selected one of the first input terminal or the second input terminal is coupled to the first clock-controlled switch, wherein switching of the first clock-controlled switch is controllable by the first clock signal, wherein the first pair of output selection switches is controllable by the first control signal such that a selected one of the first output terminal or the second output terminal is coupled to the first clock-controlled switch;

wherein the second switch group comprises a second pair of input selection switches, a second clock-controlled switch, and a second pair of output selection switches, wherein the second pair of input selection switches is controllable by the first control signal such that a selected one of the first input terminal or the second input terminal is coupled to the second clock-controlled switch, wherein switching of the second clock-controlled switch is controllable by the first clock signal, wherein the second pair of output selection switches is controllable by the first control signal such that a selected one of the first output terminal or the second output terminal is coupled to the second clock-controlled switch;

wherein the third switch group comprises a third pair of input selection switches, a third clock-controlled switch, and a third pair of output selection switches, wherein the third pair of input selection switches is controllable by the first control signal such that a selected one of the first input terminal or the second input terminal is coupled to the third clock-controlled switch, wherein switching of the third clock-controlled switch is controllable by a second clock signal, wherein the third pair of output selection switches is controllable by the first control signal such that a selected one of the first output terminal or the second output terminal is coupled to the third clock-controlled switch;

wherein the fourth switch group comprises a fourth pair of input selection switches, a fourth clock-controlled switch, and a fourth pair of output selection switches, wherein the fourth pair of input selection switches is controllable by the first control signal such that a selected one of the first input terminal or the second input terminal is coupled to the fourth clock-controlled switch, wherein switching of the fourth clock-controlled switch is controllable by the second clock signal, wherein the fourth pair of output selection switches is controllable by the first control signal such that a selected one of the first output terminal or the second output terminal is coupled to the fourth clock-controlled switch.

29. The apparatus of claim 28, wherein when the first control signal has the non-periodic setting:
- the first switch group is controlled to select the first input terminal and the first output terminal;
- the second switch group is controlled to select the second input terminal and the second output terminal;
- the third switch group is controlled to select the first input terminal and the second output terminal; and
- the fourth switch group is controlled to select the second input terminal and the first output terminal.

\* \* \* \* \*